(12) United States Patent
Mizuno

(10) Patent No.: US 6,414,556 B1
(45) Date of Patent: *Jul. 2, 2002

(54) VOLTAGE CONTROLLED OSCILLATOR HAVING AN OSCILLATION FREQUENCY VARIATION MINIMIZED IN COMPARISON WITH A POWER SUPPLY VOLTAGE VARIATION

(75) Inventor: Masayuki Mizuno, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/711,359

(22) Filed: Sep. 5, 1996

(30) Foreign Application Priority Data

Sep. 6, 1995 (JP) .............................. 7-254725

(51) Int. Cl.[7] .................................. H03B 5/24
(52) U.S. Cl. ..................... 331/57; 331/74; 331/177 R; 331/185
(58) Field of Search .............................. 331/34, 57, 74, 331/116 FE, 175, 177 R, 179, 185, 186; 327/540, 541; 326/62, 63, 68, 80, 81

(56) References Cited

U.S. PATENT DOCUMENTS

| | | | | |
|---|---|---|---|---|
| 3,801,831 A | * | 4/1974 | Dame ........................... | 326/81 |
| 3,950,940 A | * | 4/1976 | Nishimura et al. ........ | 326/81 X |
| 5,175,512 A | * | 12/1992 | Self .......................... | 326/81 X |
| 5,483,205 A | * | 1/1996 | Kawamura ................... | 331/74 |
| 5,485,126 A | * | 1/1996 | Gersbach et al. ............. | 331/57 |
| 5,512,861 A | * | 4/1996 | Sharma ........................ | 331/74 |
| 5,568,099 A | * | 10/1996 | Du .............................. | 331/57 |
| 5,789,942 A | * | 8/1998 | Mizuno ..................... | 326/68 X |

OTHER PUBLICATIONS

Ian A. Young, et al., "A PLL Clock Generator With 5 to 110 MHz of Lock Range for Microprocessors", IEEE Journal of Solid–State Circuits, vol. 27, No. 11, Nov. 1992, pp. 1599–1607.

* cited by examiner

*Primary Examiner*—David Mis
(74) *Attorney, Agent, or Firm*—Dickstein, Shapiro, Morin & Oshinsky, LLP

(57) ABSTRACT

A voltage controlled oscillator comprises an oscillator connected between a power supply line and a low potential power supply voltage and having an output node for outputting an oscillation signal having a frequency changed in accordance with a voltage difference between the power supply line and the low potential power supply voltage. An nMOS transistor is connected at its drain to a high low potential power supply voltage and at its source connected to the power supply line of the oscillator. A gate electrode of the nMOS transistor is connected to receive a control signal so that a source voltage of the nMOS transistor is determined by a voltage of the control signal and is supplied to the power supply line of the oscillator, with the result that the oscillation frequency of the oscillator is controlled by the voltage of the control signal. A level converter is connected between the high potential power supply voltage and the low potential power supply voltage and has an input node connected to the output node of the oscillator and an output terminal for outputting an output signal. The level converter converts an amplitude of the oscillation signal to an amplitude of the output signal corresponding to a voltage difference between the high and low potential power supply voltages. Thus, a voltage controlled oscillator having an excellent insensibility to a power supply voltage variation can be realized.

15 Claims, 13 Drawing Sheets

VOLTAGE CONTROLLED OSCILLATOR HAVING AN OSCILLATION FREQUENCY VARIATION MINIMIZED IN COMPARISON WITH A POWER SUPPLY VOLTAGE VARIATION

BACKGROUND OF THE INVENTION

1. Field of the Invention

The present invention relates to a voltage controlled oscillator, and more specifically to a voltage controlled oscillator having an oscillation frequency variation minimized in comparison with a power supply voltage variation.

2. Description of Related Art

For example, Ian A. Young et al., "A PLL Clock Generator with 5 to 110 MHz of Lock Range for Microprocessors", IEEE Journal of Solid State Circuits, Vol. 27, No. 11, pp.1599–1607, November 1992, proposes one prior art voltage controlled oscillator, the disclosure of which is incorporated by reference in its entirety into this application.

Referring to FIG. 1, there is shown a circuit diagram of one example of the prior art voltage controlled oscillator based on the above quoted paper. This prior art voltage controlled oscillator includes a ring oscillator constituted of a plurality of differential amplifier type delay circuits 912 which are connected in cascade to form a closed ring by feeding back an output of a last stage delay circuit to an input of a first stage delay circuit, a dummy bias circuit 911 and a voltage-to-current converter 910, coupled as shown.

Each of the delay circuits 912 includes a pair of pMOS transistors $MP_{101}$ and $MP_{102}$ having their sources common-connected to each other o form a differential pair, a constant current source pMOS transistor $MP_{103}$ connected between a first power supply voltage terminal 920 and the common-connected sources of the pMOS transistors $MP_{101}$ and $MP_{102}$, and a pair of voltage controlled resistors 901 connected, as a load, between a drain of the pMOS transistors $MP_{101}$ and $MP_{102}$ and a second power supply voltage terminal 921, respectively. Here, the voltage controlled resistor means a resistor having its resistance value which can be controlled by the magnitude of an applied voltage. A low level of an output of each delay circuit 912 (namely, an output of the oscillator) is at a potential level of the second power supply voltage terminal 921. Assuming that a current value of the associated constant current source $MP_{103}$ is "I" and a resistance value of the associated voltage controlled resistors 901 is "R", a high level of the output of each delay circuit 912 is a potential level which is higher than the potential level of the second power supply voltage terminal 921, by a voltage of "R·I".

Furthermore, an input-to-output delay time of each delay circuit 912 is determined by both of a potential difference between a potential level of a current control signal line 930 and a potential level of the first power supply voltage terminal 920, and a potential difference between a potential level of a voltage control signal line 931 and a potential level of the second power supply voltage terminal 921. Namely, the input-to-output delay time is determined by a gate-source voltage of the constant current source pMOS transistor $MP_{103}$ (constant current value) and the resistance value of the voltage controlled resistors 901 functioning as a load resistor.

In addition, an oscillation frequency of the signal obtained from an output terminal 922 is determined by a potential difference between a potential level on a control terminal 923 of the voltage-to-current converter 910 and the potential level of the second power supply voltage 921, by action of the voltage-to-current converter 910.

The dummy bias circuit 911 operates to determine a potential level of the voltage control signal line 931 to the effect that the signal obtained from an output terminal 922 assumes a high level equal to a potential level given to an amplitude control terminal 924 and a low level equal to the potential level of the second power supply voltage 921.

In brief, the dummy bias circuit 911 comprises, similarly to the delay circuit 912, a constant current source pMOS transistor $MP_{103}$, a differential transistor pair consisting of a pair of pMOS transistors $MP_{101}$ and $MP_{102}$, and a pair of voltage controlled resistors 901 functioning as a load resistor. The dummy bias circuit 911 further includes an operational amplifier $OP_1$ having an inverting input connected to the amplitude control terminal 924 and a non-inverting input connected to a connection node $N_1$ between one transistor $MP_{102}$ of the differential transistor pair and the associated voltage controlled resistor 901. An output of the operational amplifier $OP_1$ is applied to a control input of the voltage controlled resistors 901 in the dummy bias circuit 911, thereby to make a potential of the node $N_1$ equal to a high level reference voltage applied to the amplitude control terminal 924. Furthermore, the output of the operational amplifier $OP_1$ is applied through the current control signal line 931 to a control input of all the voltage controlled resistors 901 of the delay circuits 901, so that the high level of the signal obtained from an output terminal 922 becomes equal to the high level reference voltage given to an amplitude control terminal 924.

With the above mentioned arrangement, even if the current value of the constant current source in each delay circuit 912 is caused to change (namely, the oscillation frequency is changed), the amplitude of the signal obtained from an output terminal 922 is maintained at a constant magnitude.

In the above mentioned prior art voltage controlled oscillator, in ordinary cases, the potential level of the signal supplied to the control terminal 923 varies or fluctuates in phase with the voltage level of the second power supply voltage terminal 921. Therefore, even if the voltage level of the second power supply voltage terminal 921 varies or fluctuates, the oscillation frequency of the signal obtained from the output terminal 922 is subjected to almost no influence.

However, when the voltage level of the first power supply voltage terminal 920 varies or fluctuates, the voltage-to-current converter 910 controls the potential level of the current control signal line 930 in order to avoid variation of the input-to-output delay time of each delay circuit 912. However, if the frequency of the variation or fluctuation of the voltage level of the first power supply voltage terminal 920 becomes as high as the voltage-to-current converter 910 cannot follow the voltage level variation or fluctuation, the input-to-output delay time of each delay circuit 912 changes, with the result that the oscillation frequency of the signal obtained from the output terminal 922 changes. As a result, for example, it is not possible to cope with a temporary voltage drop within a LSI (large scaled integrated circuit) chip caused because a current starts or stops flowing when a part of circuits in the LSI chip starts or stop operating.

Here, the frequency of the voltage level variation or fluctuation which the voltage-to-current converter 910 cannot follow, is determined by a parasitic capacitance of the current control signal line 930, a gate capacitance of the pMOS transistors having a gate connected to the current control signal line 930, and the characteristics of a pMOS transistor which constitutes the current control signal line 930.

SUMMARY OF THE INVENTION

Accordingly, it is an object of the present invention to provide a voltage controlled oscillator which has overcome the above mentioned defect of the conventional one.

Another object of the present invention is to provide a voltage controlled oscillator having an oscillation frequency variation minimized in comparison with a power supply voltage variation.

The above and other objects of the present invention are achieved in accordance with the present invention by a voltage controlled oscillator including:

an oscillator connected between a high potential power supply line and a low potential power supply line, for generating an oscillation signal having a frequency changing dependently upon a voltage difference between the high potential power supply line and the low potential power supply line, and a transistor connected between one of the high potential power supply line and the low potential power supply line and a power supply terminal for supplying a voltage to the one of the high potential power supply line and the low potential power supply line, a control signal being applied to a control electrode of the transistor to control the frequency of the oscillation of the oscillator.

In one variation, the transistor is a MOS transistor having a source connected to the one of the high potential power supply line and the low potential power supply line, and a drain connected to the power supply terminal, the control signal being applied to a gate electrode of the MOS transistor.

In another variation, the transistor is a bipolar transistor having an emitter connected to the one of the high potential power supply line and the low potential power supply line, and a collector connected to the power supply terminal, the control signal being applied to a base electrode of the MOS transistor.

In a preferred embodiment, the voltage controlled oscillator further includes a level shift means connected to the high potential power supply line, the low potential power supply line and the power supply terminal, the level shift means receiving the oscillation signal of the oscillator and converting a level of the oscillation signal corresponding to a potential of the one of the high potential power supply line and the low potential power supply line, to a voltage level of the power supply terminal.

More preferably, the oscillator has a control terminal in addition for a terminal for the high potential power supply line, a terminal for the low potential power supply line, and a terminal for the output signal, and the oscillator is configured to be capable of controlling the frequency of the oscillation signal of the oscillator by means of a voltage applied to the control terminal.

According to another aspect of the present invention, there is provided a voltage controlled oscillator comprising:

an oscillator connected between a first power supply line and a second power supply line and having an output node for outputting an oscillation signal having a frequency changed in accordance with a voltage difference between the first power supply line terminal and the second power supply line;

a level converter connected to the second power supply line and a third power supply line and having an input node connected to the output node of the oscillator and an output terminal for outputting an output signal, the level converter converting an amplitude of the oscillation signal to an amplitude of the output signal corresponding to a voltage difference between the second power supply line and the third power supply line; and a transistor connected between the first power supply line and the third power supply line and having a control electrode connected to receive a control signal so that the oscillation frequency of the oscillation signal of the oscillator is controlled by a voltage of the control signal.

In one embodiment, the second power supply line is connected to a low potential power supply voltage, and the third power supply line is connected to a high potential power supply voltage, and the transistor is an nMOS transistor having a source connected to the first power supply line and a drain connected to the third power supply line, a gate of the nMOS transistor being connected to receive the control signal.

In another embodiment, the second power supply line is connected to a high potential power supply voltage, and the third power supply line is connected to a low potential power supply voltage, and the transistor is a pMOS transistor having a source connected to the first power supply line and a drain connected to the third power supply line, a gate of the pMOS transistor being connected to receive the control signal.

In still another embodiment, the second power supply line is connected to a low potential power supply voltage, and the third power supply line is connected to a high potential power supply voltage, and the transistor is an npn transistor having a collector connected to the third power supply line and an emitter connected to the first power supply line, a base of the npn transistor being connected to receive the control signal.

In a further embodiment, the second power supply line is connected to a high potential power supply voltage, and the third power supply line is connected to a low potential power supply voltage, and the transistor is a pnp transistor having a collector connected to the third power supply line and an emitter connected to the first power supply line, a base of the pnp transistor being connected to receive the control signal.

According to still another aspect of the present invention, there is provided a voltage controlled oscillator comprising:

an oscillator connected between a first power supply line and a second power supply line and having an output node for outputting an oscillation signal having a frequency changed in accordance with a voltage difference between the first power supply line terminal and the second power supply line;

a level converter between a third power supply line and a fourth power supply line and having an input node connected to the output node of the oscillator and an output terminal for outputting an output signal, the level converter converting an amplitude of the oscillation signal to an amplitude of the output signal corresponding to a voltage difference between the third power supply line and the fourth power supply line;

a first transistor connected between the first power supply line and the third power supply line and having a control electrode connected to receive a first control signal; and a second transistor connected between the second power supply line and the fourth power supply line and having a control electrode connected to receive a second control signal, so that the oscillation frequency of the oscillation signal of the oscillator is controlled by a voltage of the first control signal and a voltage of the second control signal.

In one embodiment, the third power supply line is connected to a high potential power supply voltage, and the fourth power supply line is connected to a low potential power supply voltage, and wherein the first transistor is an nMOS transistor having a source connected to the first power supply line and a drain connected to the third power supply line, a gate of the nMOS transistor being connected to receive the first control signal, and the second transistor is a pMOS transistor having a source connected to the second power supply line and a drain connected to the fourth power supply line, a gate of the pMOS transistor being connected to receive the second control signal.

In another embodiment, the third power supply line is connected to a high potential power supply voltage, and the fourth power supply line is connected to a low potential power supply voltage, and wherein the first transistor is an npn transistor having a collector connected to the third power supply line and an emitter connected to the first power supply line, a base of the npn transistor being connected to receive the first control signal, and the second transistor is a pnp transistor having a collector connected to the fourth power supply line and an emitter connected to the second power supply line, a base of the pnp transistor being connected to receive the second control signal.

As explained above, the voltage controlled oscillator in accordance with the present invention realizes an excellent insensibility against a power supply voltage variation, by utilizing the nature that a potential of a source electrode of a MOS transistor is determined by a gate voltage and a drain current, independently of a voltage of a drain electrode of the MOS transistor.

In brief, the voltage controlled oscillator in accordance with the present invention is characterized in that, in an oscillator having an oscillation frequency determined by a voltage difference between a first power supply line and a second power supply line, a MOS transistor is inserted in such a manner that a source of the MOS transistor is connected to the first or second power supply line and a drain of the MOS transistor is connected to a power supply voltage which may vary. With this connection, the potential of the source of the MOS transistor is determined by a voltage applied to a gate of the MOS transistor and a drain current of the MOS transistor.

Here, the drain current itself of the MOS transistor is determined by the gate voltage of the MOS transistor and a consumption current of the oscillator, and the consumption current of the oscillator is also directly determined by the gate voltage of the MOS transistor. Therefore, the oscillation frequency of the oscillator is determined by the gate voltage of the MOS transistor. Thus, even if the voltage on the drain of the MOS transistor varies, the voltage on the source of the MOS transistor does not change, with the result that the voltage controlled oscillator in accordance with the present invention is not influenced by the power supply voltage variation.

In addition, even if a bipolar transistor is used in place of the MOS transistor, a similar advantage can be obtained.

The above and other objects, features and advantages of the present invention will be apparent from the following description of preferred embodiments of the invention with reference to the accompanying drawings.

DESCRIPTION OF THE PREFERRED EMBODIMENTS

Figure 1:
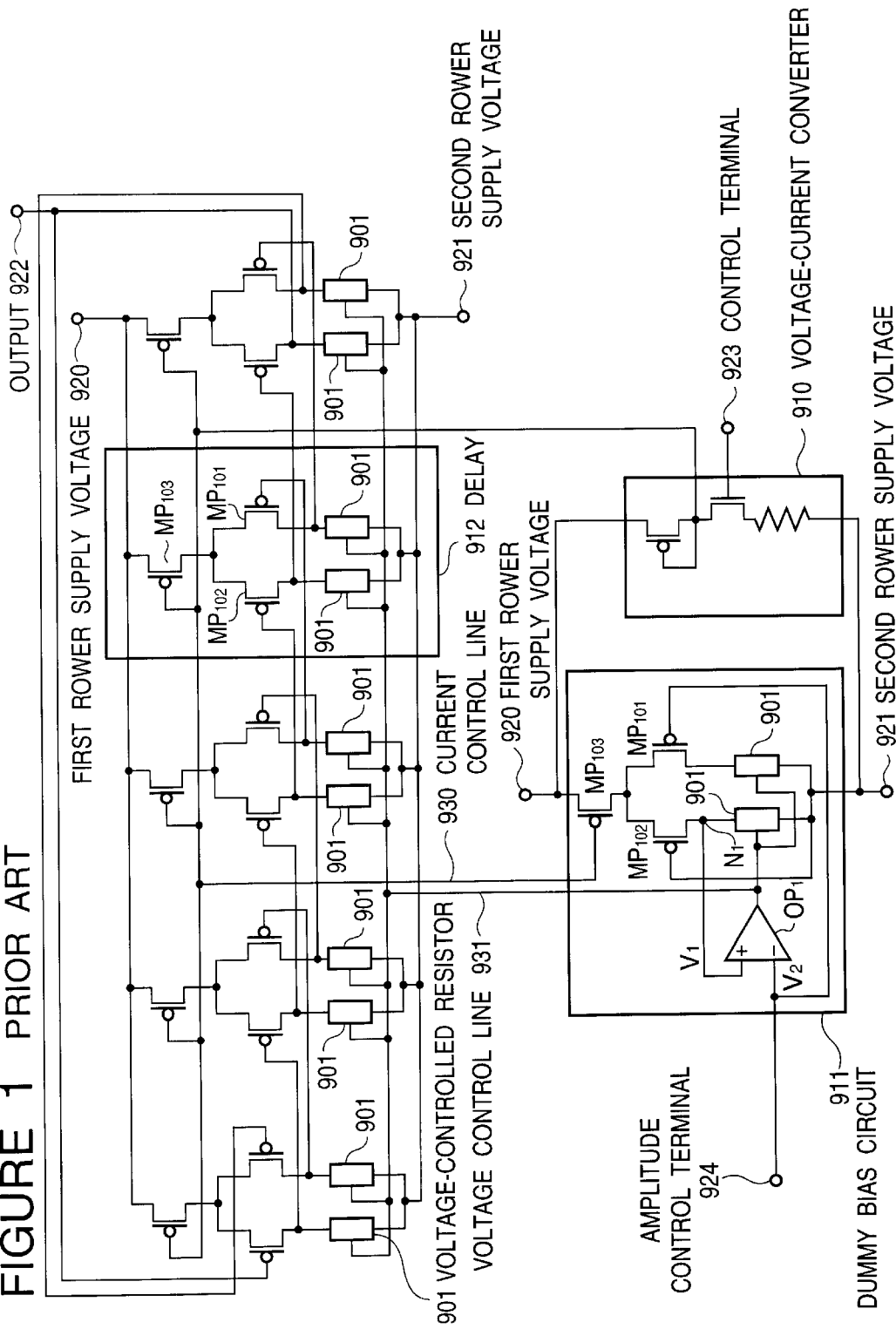
FIG. 1 is a circuit diagram of one example of the prior art voltage controlled oscillator.
Figure 2:
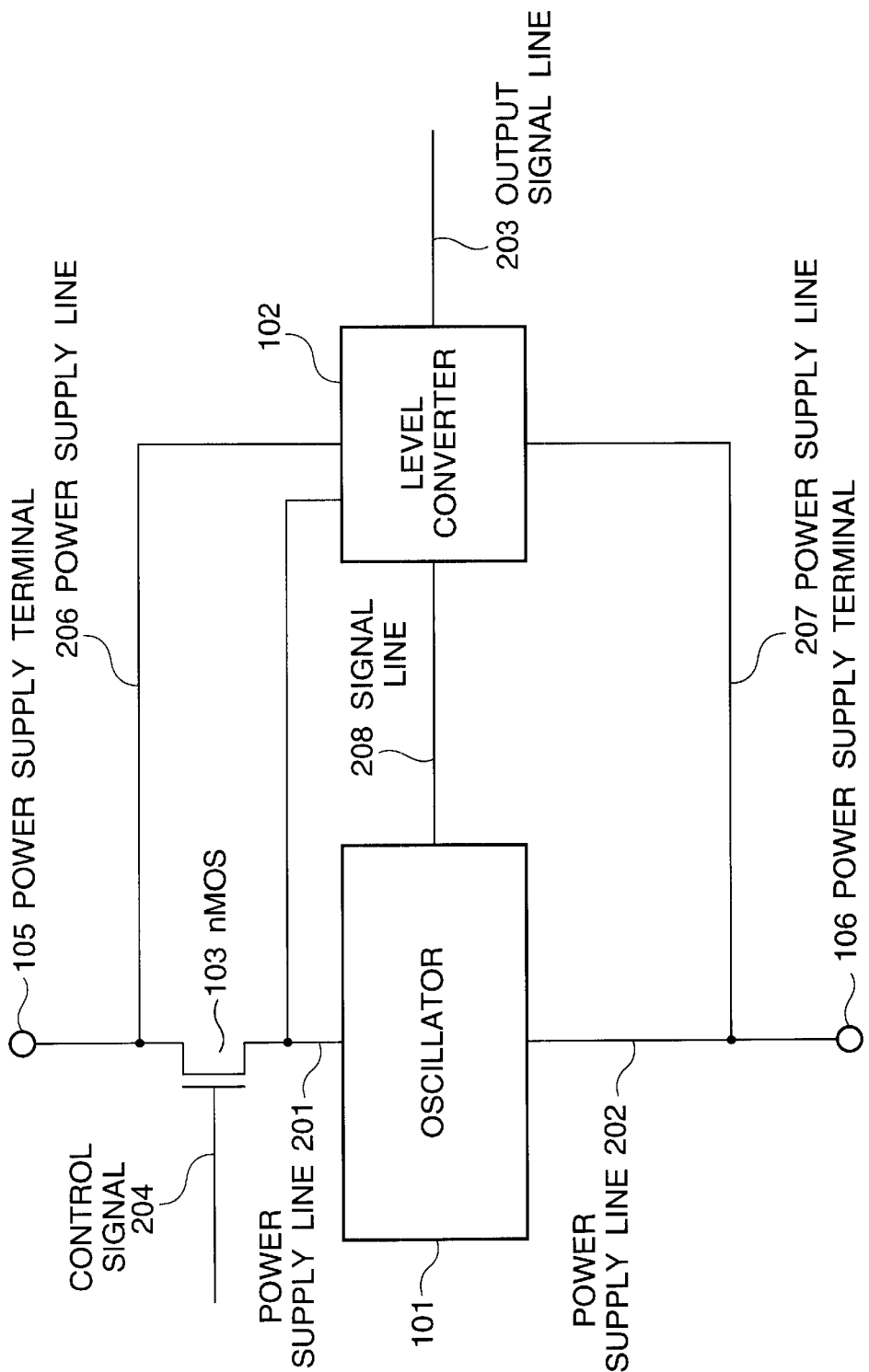
FIG. 2 is a block diagram of a first embodiment of the voltage controlled oscillator in accordance with the present invention.

Referring to FIG. 2, there is shown a block diagram of a first embodiment of the voltage controlled oscillator in accordance with the present invention.

As shown in FIG. 2, the first embodiment of the voltage controlled oscillator in accordance with the present invention comprises an oscillator 101 connected between a first power supply line 201 and a second power supply line 202 connected to a second power supply terminal 106 (for a low potential power supply voltage) and configured to generate, on an signal line 208, an oscillation signal having a frequency corresponding to a potential difference between the first power supply line 201 and the second power supply line 202, and an nMOS transistor 103 having a drain connected to a first power supply terminal 201 (for a high potential power supply voltage), a source connected to the first power supply line 201, and a gate connected to a control signal line 204. The oscillation signal outputted onto the signal line 208 takes a high level corresponding to a potential appearing on the first power supply line 201 and a low level corresponding to a potential appearing on the second power supply line 202.

This oscillation signal outputted on the signal line 208 is supplied to a level converter 102, which is connected to the power supply line 201, a third power supply line 206 connected to the power supply terminal 105, and a fourth power supply line 207 connected to the power supply terminal 106. This level converter 102 converts the received signal into a signal, which is outputted onto an output signal line 203, and which takes a high level corresponding to a potential appearing on the third power supply line 206 and a low level corresponding to a potential appearing on the fourth power supply line 207.

Figure 3:
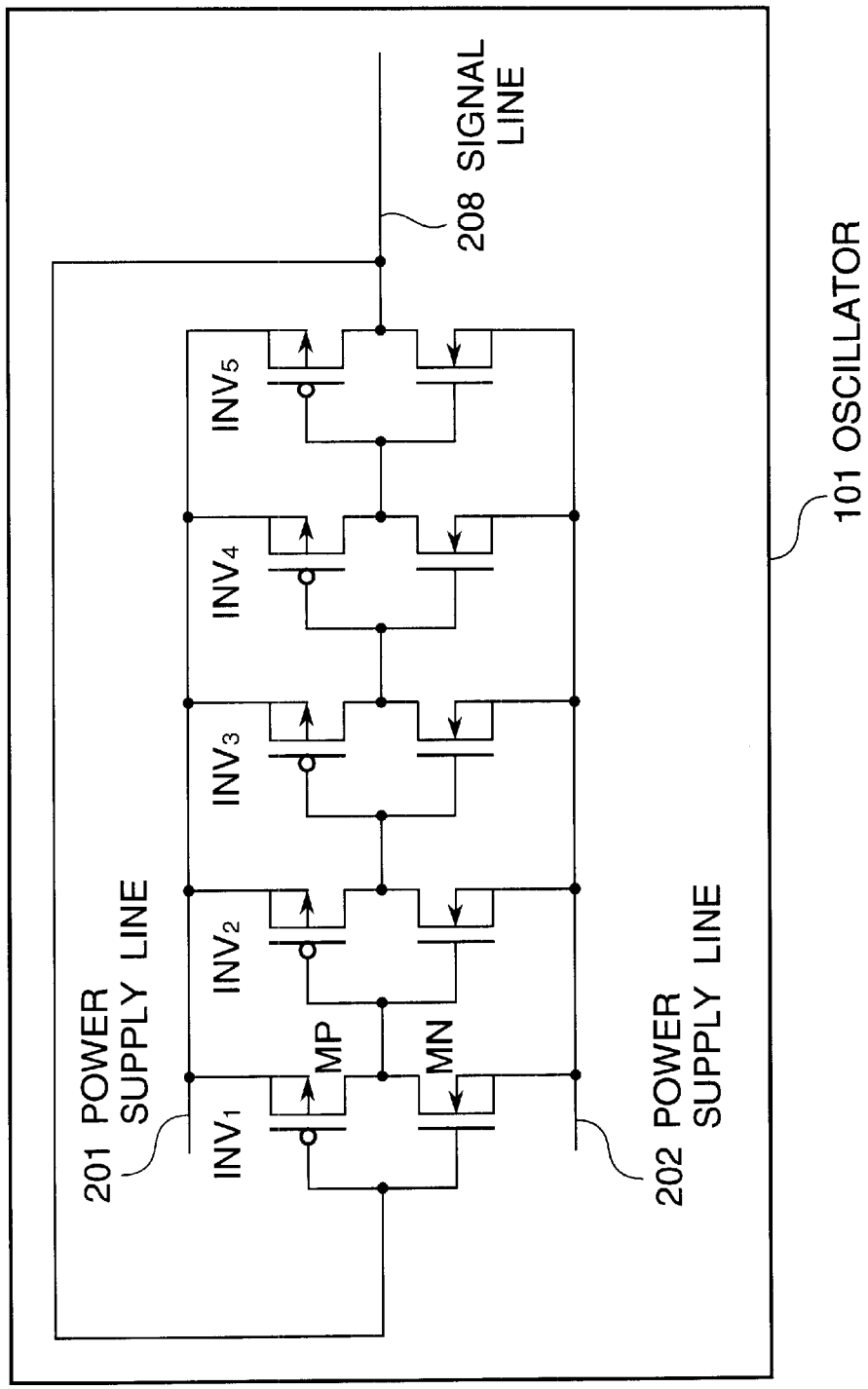
FIG. 3 is a circuit diagram of the oscillator used in the first embodiment of the voltage controlled oscillator shown in FIG. 2.

Referring to FIG. 3, there is shown a circuit diagram of the oscillator 101 used in the first embodiment of the voltage controlled oscillator shown in FIG. 2. The shown oscillator is constituted of an odd number of cascaded inverters such as CMOS inverters (in the example shown, five CMOS inverters $INV_1$ to $INV_5$) connected to form a ring or a closed loop (by connecting an output of a final stage CMOS inverter $INV_5$ to an output of an initial stage CMOS inverter $INV_1$). Each of the CMOS inverters $INV_1$ to $INV_5$ includes a pMOS transistor MP and an nMOS transistor MN connected in series between the first power supply line 201 and the second power supply line 202 and having a gate common-connected to form an input of the CMOS inverter. Common-connected sources of the pMOS transistor MP and the nMOS transistor MN constitute an output of the CMOS inverter.

Furthermore, as shown in FIG. 3, a substrate bias potential for the pMOS transistor MP in each CMOS inverter is connected to the first power supply line 201, and a substrate bias potential for the nMOS transistor MN in each CMOS inverter is connected to the second power supply line 202. This substrate biasing for each MOS transistor can be surely realized in a triple-well structure, well known to persons skilled in the art, but in the embodiment shown in FIG. 2, this substrate biasing can be realized even in a double-well structure using a p-type substrate, as can be readily understood by persons skilled in the art.

The ring oscillator shown in FIG. 3 merely shows one example which can be used as the oscillator 101 of the voltage controlled oscillator in accordance with the present invention, and therefore, the present invention is in no way limited to the ring oscillator shown in FIG. 3.

Figure 4:
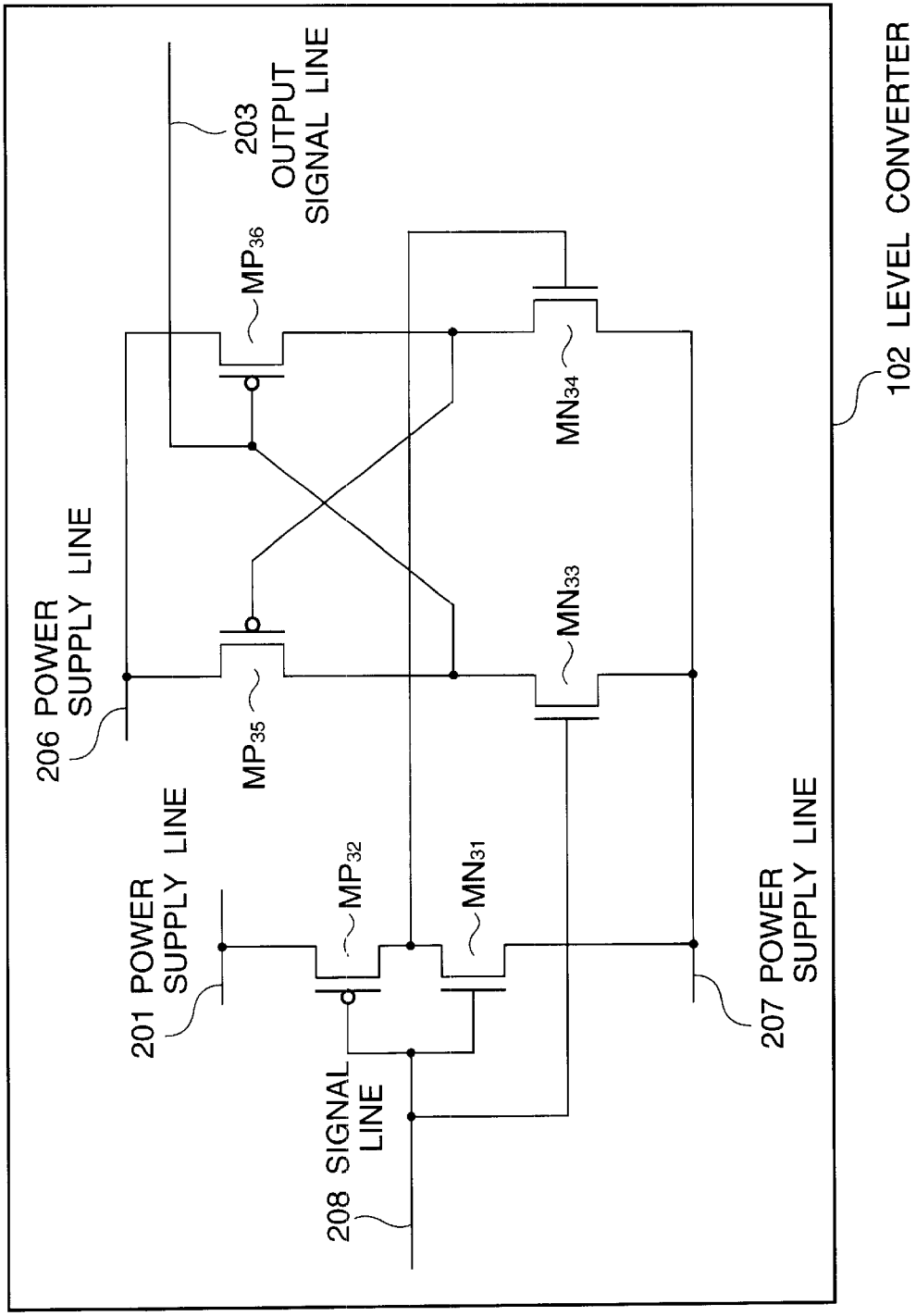
FIG. 4 is a circuit diagram of the level converter used in the first embodiment of the voltage controlled oscillator shown in FIG. 2.

Referring to FIG. 4, there is shown a circuit diagram of the level converter 102 used in the first embodiment of the voltage controlled oscillator shown in FIG. 2.

The shown level converter 102 includes a CMOS inverter composed of a pMOS transistor $MP_{32}$ and an nMOS transistor $MN_{31}$ connected in series between the first power supply line 201 and the fourth power supply line 207 and having a gate common-connected to the signal line 208, and a differential circuit comprising two nMOS transistors $MN_{33}$ and $MN_{34}$ having a source common-connected to the fourth power supply line 207, a gate of $MN_{33}$ being connected to the signal line 208 and a gate of $MN_{34}$ being connected to an output of the CMOS inverter (an inverted signal of the signal on the signal line 208), and two pMOS transistors $MP_{35}$ and $MP_{36}$ connected between the third power supply line 206 and a drain of the nMOS transistors $MN_{33}$ and $MN_{34}$, respectively, a gate of pMOS transistors $MP_{35}$ and $MP_{36}$ being cross-connected to the drain of the nMOS transistors $MN_{33}$ and $MN_{34}$, respectively. Namely, the gate of the pMOS transistor $MP_{35}$ is connected to the drain of the nMOS transistor $MN_{34}$, and the gate of the pMOS transistor $MP_{36}$ is connected to the drain of the nMOS transistor $MN_{33}$. The output signal line 203 is connected to a connected node between the gate of the pMOS transistor $MP_{36}$ and the drain of the nMOS transistor $MP_{33}$.

With this arrangement, the high level of the output signal appearing on the output signal line 203 takes the potential appearing on the third power supply line 206. Incidentally, the level converter shown in FIG. 4 merely shows one example which can be used as the level converter 102 of the voltage controlled oscillator in accordance with the present invention, and therefore, the present invention is in no way limited to the level converter shown in FIG. 4.

Returning to FIG. 2, since the source of the nMOS transistor 103 is connected to the first power supply line 201, the potential $V_{hin}$ of the first power supply line 201 is determined by the potential $V_{hc}$ of the control signal line 204 and a current I flowing to the first power supply line 201, by the following equation (1):

$$V_{hin}=V_{hc}-\{(2I/Kn)^{1/\alpha_n}+V_{tn}\} \quad (1)$$

where
  $Kn$ is a gain constant of nMOS transistor 103
  $V_{tn}$ is a threshold of nMOS transistor 103
  $\alpha_n$ is a predetermined constant The above equation (1) is derived from the fact that, in a saturated region of an nMOS transistor, a drain current $I_{DS}$ of the nMOS transistor is approximately equal to a value of $(V_{GS}-V_t)^\alpha \cdot (K/2)$ (where $V_{GS}$=gate-source voltage of nMOS transistor, and $V_t$ is a threshold of nMOS transistor). In the circuit shown in FIG. 2, $V_{GS}=V_{hc}-V_{hin}$.

Therefore, even if the potential given to the first power supply terminal 105 varies, the potential $V_{hin}$ on the first power supply line 201 does not vary.

The frequency of the oscillator 101 changes dependently upon the potential difference between the first power supply line 201 and the second power supply line 202, and therefore, can be controlled by the potential $V_{hc}$ of the control signal line 204.

Since the oscillation signal outputted on the signal line 208 from the oscillator 101 takes the high level corresponding to the potential of the first power supply line 201 and the low level corresponding to the potential of the second power supply line 202, the signal thus obtained is converted by the level converter 102 to the signal which takes the high level corresponding to the potential of the third power supply line 206 and the low level corresponding to the potential of the fourth power supply line 207 (which is the same potential as that of the second power supply line 202). This level converted signal is outputted onto the output signal line 203.

If the above mentioned level conversion is not necessary (for example, if the amplitude of the output signal may be small), even if the level converter 102 as mentioned above is omitted, it is possible to realize the voltage controlled oscillator which has minimized the influence of the power supply voltage variation.

The above mentioned approach for minimizing the influence of the power supply voltage variation by use of the nMOS transistor 103 can be applied not only to the voltage controlled oscillator mentioned above but also to a voltage controlled oscillator in which the oscillator 101 is replaced with another circuit.

Figure 5:
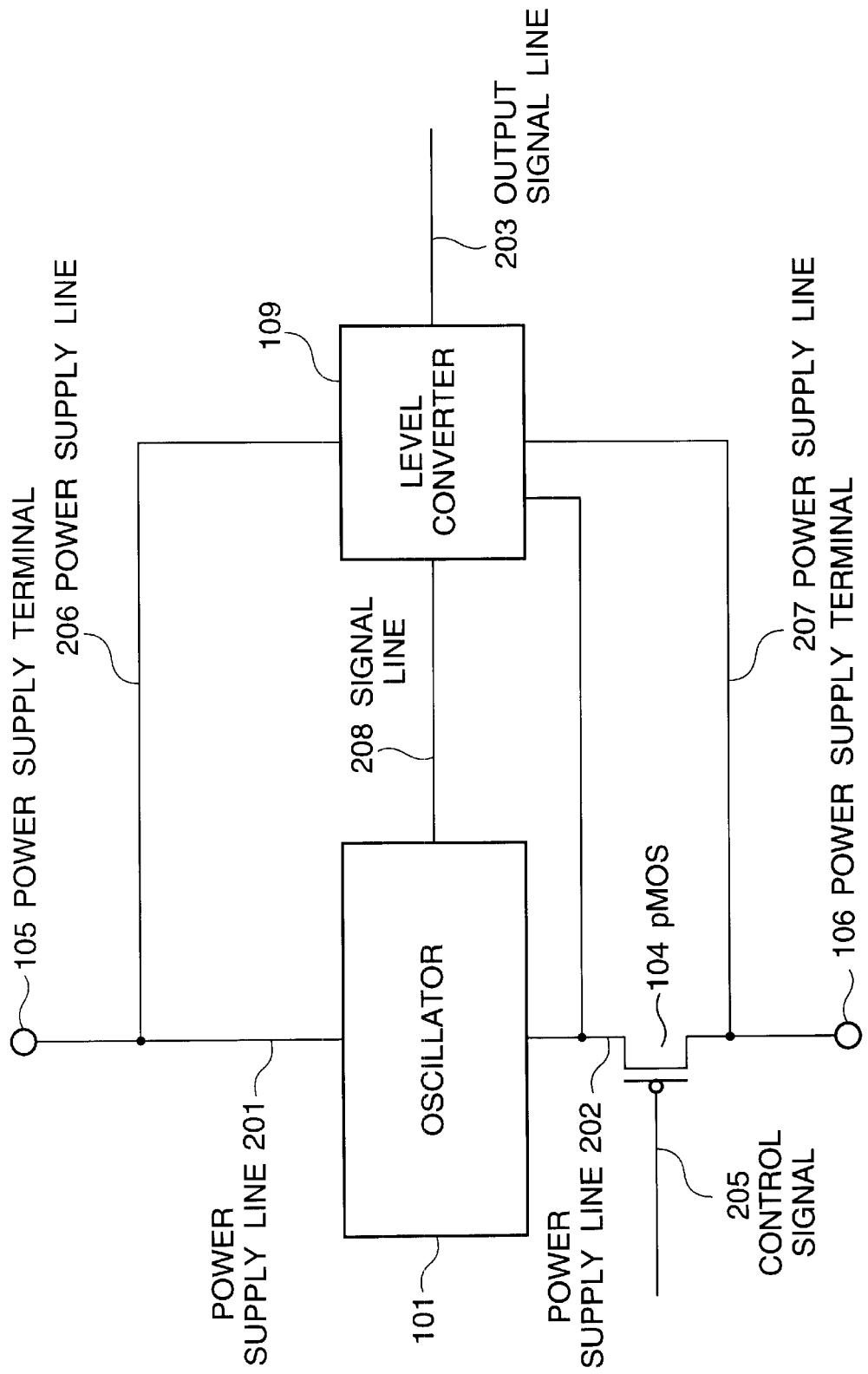
FIG. 5 is a block diagram of a second embodiment of the voltage controlled oscillator in accordance with the present invention.

Referring to FIG. 5, there is shown a block diagram of a second embodiment of the voltage controlled oscillator in accordance with the present invention. In FIG. 5, elements similar to those shown in FIG. 2 are given the same Reference Numerals.

As shown in FIG. 5, the second embodiment of the voltage controlled oscillator in accordance with the present invention comprises the oscillator 101 connected between the second power supply line 202 and the first power supply line 201 connected to the first power supply terminal 105 and configured to generate, on the signal line 208, the oscillation signal having the frequency corresponding to the potential difference between the first power supply line 201 and the second power supply line 202, and a pMOS transistor 104 having a drain connected to the second power supply terminal 106, a source connected to the second power supply line 202, and a gate connected to a control signal line 205. The signal outputted onto the signal line 208 takes a high level corresponding to a potential appearing on the first power supply line 201 and a low level corresponding to a potential appearing on the second power supply line 202.

This signal outputted on the signal line 208 is supplied to a level converter 109, which is connected to the second power supply line 202, the third power supply line 206 connected to the first power supply terminal 105, and the fourth power supply line 207 connected to the second power supply terminal 106. This level converter 109 converts the received signal into a signal which takes a high level corresponding to a potential appearing on the third power supply line 206 and a low level corresponding to a potential appearing on the fourth power supply line 207. This output signal is outputted on the output signal line 203.

The oscillator 101 of this second embodiment can be constituted as shown in FIG. 3, similarly to the first embodiment. Namely, the oscillator 101 can be composed by a ring oscillator consisting of an odd number of inverters connected in the form of a ring or closed loop. As mentioned hereinbefore, the substrate biasing for the effect that the substrate bias potential for the pMOS transistor in each CMOS inverter is connected to the first power supply line 201 and the substrate bias potential for the nMOS transistor in each CMOS inverter is connected to the second power supply line 202, can be surely realized in a triple-well structure, but in the embodiment shown in FIG. 5, can also be realized even in a double-well structure using an n-type substrate, as can be readily understood by persons skilled in the art.

Figure 6:
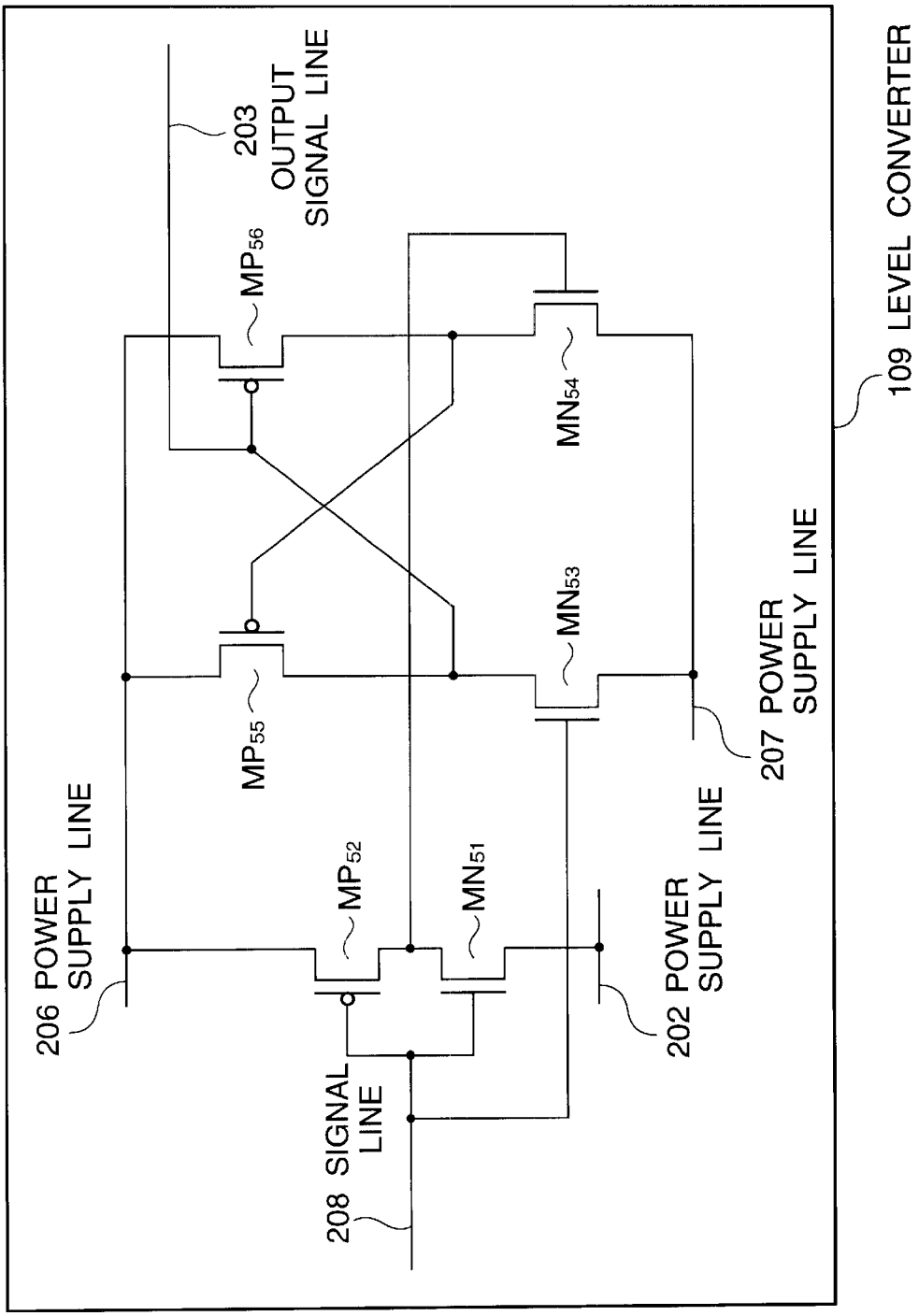
FIG. 6 is a circuit diagram of the level converter used in the second embodiment of the voltage controlled oscillator shown in FIG. 5.

Referring to FIG. 6, there is shown a circuit diagram of the level converter 109 used in the second embodiment.

The shown level converter 109 includes a CMOS inverter composed of a pMOS transistor $MP_{52}$ and an nMOS transistor $MN_{51}$ connected in series between the third power supply line 206 and the second power supply line 202 and having a gate common-connected to the signal line 208, and a differential circuit comprising two nMOS transistors $MN_{53}$ and $MN_{54}$ having a source common-connected to the fourth power supply line 207, a gate of $MN_{53}$ being connected to the signal line 208 and a gate of $MN_{54}$ being connected to an output of the CMOS inverter (an inverted signal of the signal on the signal line 208), and two pMOS transistors $MP_{55}$ and $MP_{56}$ connected between the third power supply line 206 and a drain of the nMOS transistors $MN_{53}$ and $MN_{54}$, respectively, a gate of pMOS transistors $MP_{55}$ and $MP_{56}$ being cross-connected to the drain of the nMOS transistors $MN_{53}$ and $MN_{54}$, respectively. Namely, the gate of the pMOS transistor $MP_{55}$ is connected to the drain of the nMOS transistor $MN_{54}$, and the gate of the pMOS transistor $MP_{56}$ is connected to the drain of the nMOS transistor $MN_{53}$. The output signal line 203 is connected to a connected node between the gate of the pMOS transistor $MP_{56}$ and the drain of the nMOS transistor $MP_{53}$. Incidentally, the level converter shown in FIG. 6 merely shows one example of the level converter 109, and therefore, the present invention is in no way limited to the level converter shown in FIG. 6.

Returning to FIG. 5, since the source of the pMOS transistor 104 is connected to the second power supply line 202, the potential $V_{lin}$ of the second power supply line 202 is determined by the potential $V_{lc}$ of the control signal line 205 and a current I flowing to the second power supply line 202, by the following equation (2):

$$V_{lin}=V_{lc}+\{(2I/Kp)^{1/\alpha_p}+V_{tp}\} \quad (2)$$

where
Kp is a gain constant of pMOS transistor 104
$V_{tp}$ is a threshold of pMOS transistor 104
$\alpha_p$ is a predetermined constant Therefore, even if the potential given to the second power supply terminal 106 varies, the potential $V_{lin}$ on the second power supply line 202 does not vary.

The frequency of the oscillator 101 changes dependently upon the potential difference between the first power supply line 201 and the second power supply line 202, and therefore, can be controlled by the potential $V_{lc}$ of the control signal line 205.

Since the signal outputted on the signal line 208 from the oscillator 101 takes the high level corresponding to the potential of the first power supply line 201 and the low level corresponding to the potential of the second power supply line 202, the signal thus obtained is converted by the level converter 109 to the signal which takes the high level corresponding to the potential of the third power supply line 206 and the low level corresponding to the potential of the fourth power supply line 207. This level converted signal is outputted onto the output signal line 203.

If the above mentioned level conversion is not necessary, even if the level converter 109 as mentioned above is omitted, it is possible to realize the voltage controlled oscillator which has minimized the influence of the power supply voltage variation.

The approach for minimizing the influence of the power supply voltage variation by use of the pMOS transistor in the above mentioned second embodiment can be applied not only to the voltage controlled oscillator mentioned above but also to a voltage controlled oscillator in which the oscillator 101 is replaced with another circuit.

Figure 7:
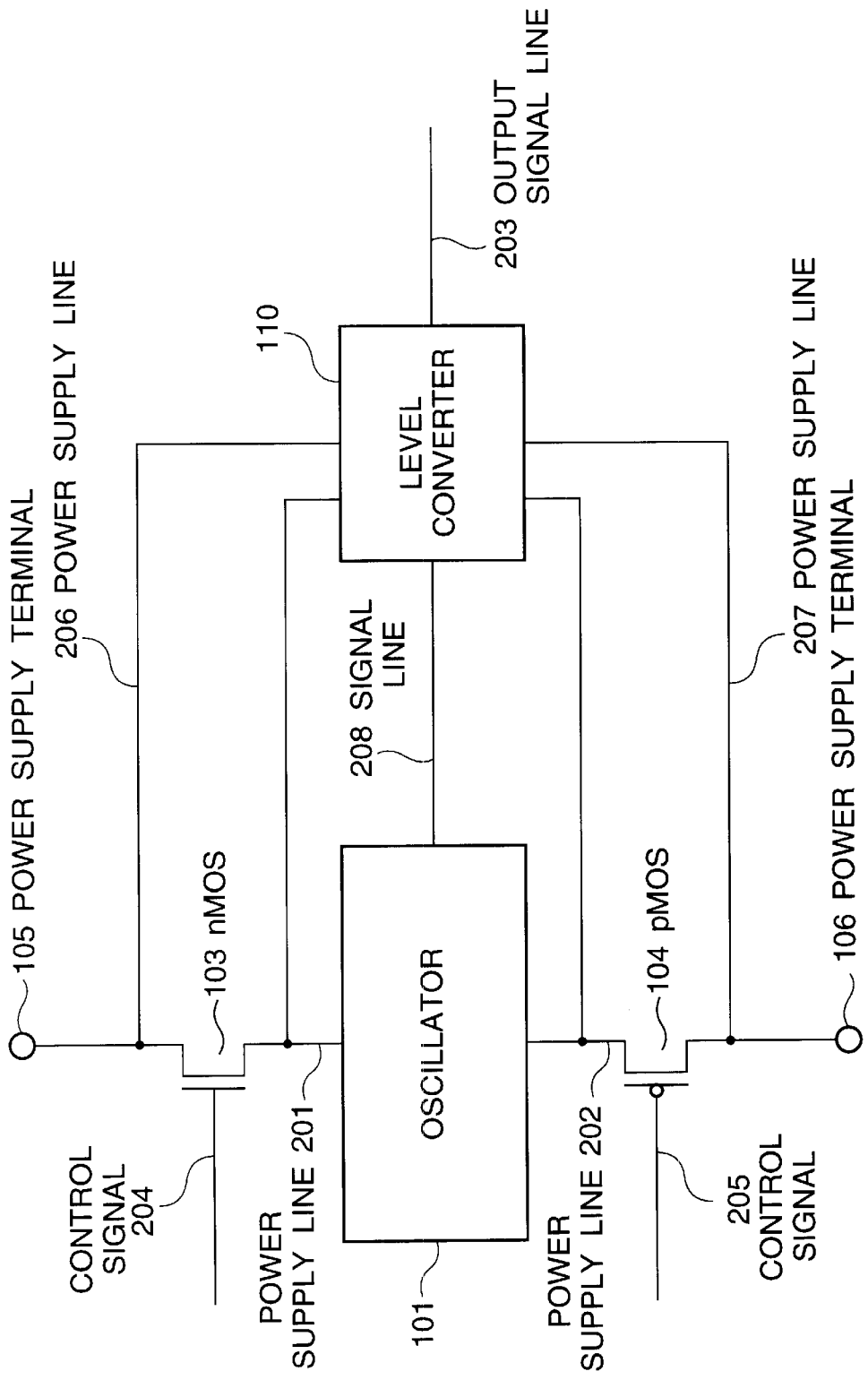
FIG. 7 is a block diagram of a third embodiment of the voltage controlled oscillator in accordance with the present invention.

Referring to FIG. 7, there is shown a block diagram of a third embodiment of the voltage controlled oscillator in accordance with the present invention. In FIG. 7, elements similar to those shown in FIG. 2 and 5 are given the same Reference Numerals.

As shown in FIG. 7, the third embodiment of the voltage controlled oscillator in accordance with the present invention comprises the oscillator 101 connected between the first power supply line 201 and the second power supply line 202 and configured to generate, on the signal line 208, the oscillation signal having the frequency corresponding to the potential difference between the first power supply line 201 and the second power supply line 202, the nMOS transistor 103 having the drain connected to the first power supply terminal 201, the source connected to the first power supply line 201, and the gate connected to the control signal line 204, and the pMOS transistor 104 having the drain connected to the second power supply terminal 106, the source connected to the second power supply line 202, and the gate connected to the control signal line 205. The signal outputted onto the signal line 208 takes the high level corresponding to the potential appearing on the first power supply line 201 and the low level corresponding to the potential appearing on the second power supply line 202.

This signal outputted on the signal line 208 is supplied to a level converter 110, which is connected to the first power supply line 201, the second power supply line 202, the third power supply line 206 connected to the first power supply terminal 105, and the fourth power supply line 207 connected to the second power supply terminal 106. This level converter 110 converts the received signal into a signal which takes a high level corresponding to a potential appearing on the third power supply line 206 connected to the first power supply terminal 105 and a low level corresponding to a potential appearing on the fourth power supply line 207 connected to the second power supply terminal 106. This output signal is outputted on the output signal line 203.

The oscillator 101 of this second embodiment can be constituted as shown in FIG. 3, similarly to the first embodiment.

Figure 8:
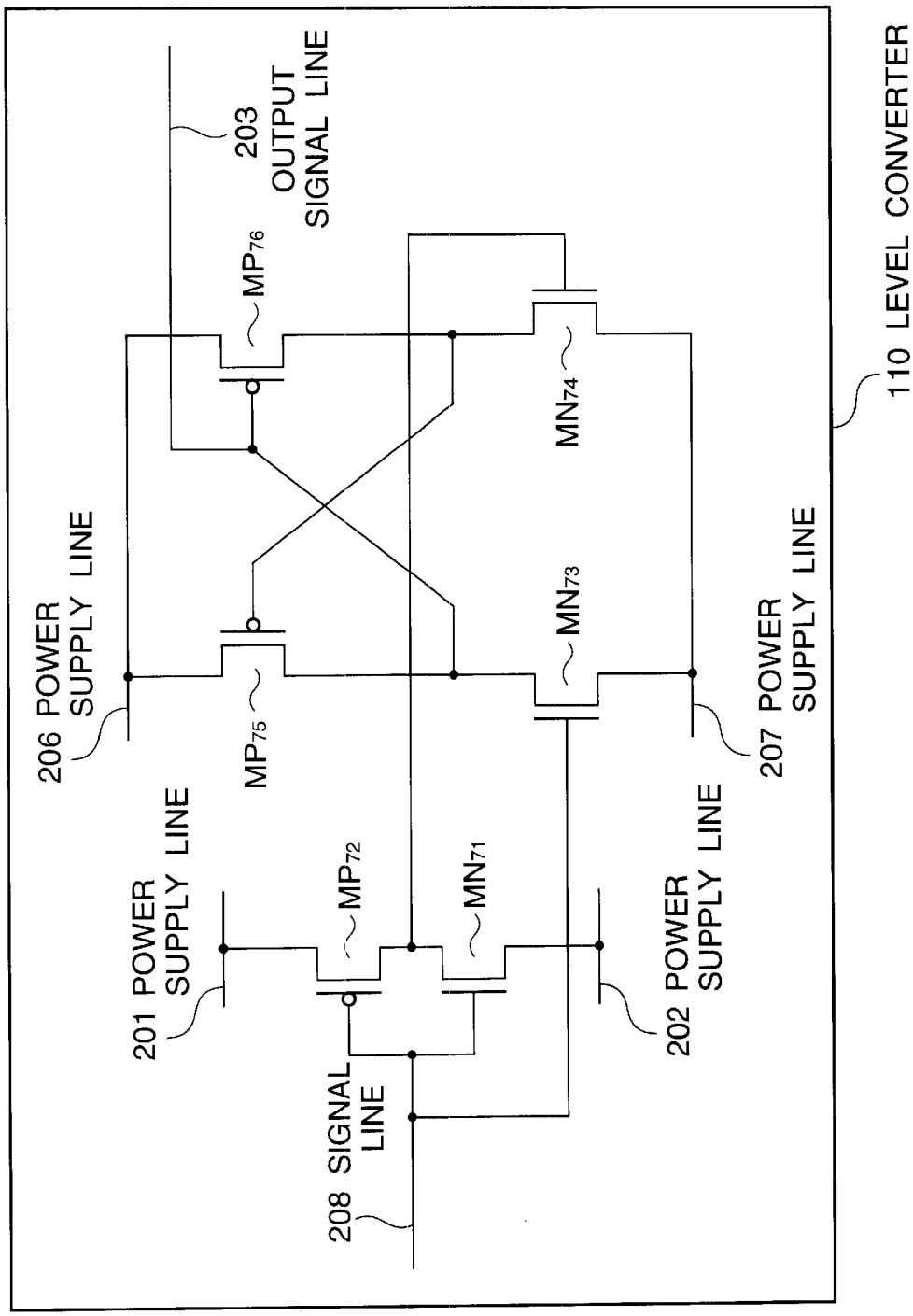
FIG. 8 is a circuit diagram of the level converter used in the third embodiment of the voltage controlled oscillator shown in FIG. 7.

Referring to FIG. 8, there is shown a circuit diagram of the level converter 110 used in the third embodiment.

The shown level converter 110 includes a CMOS inverter composed of a pMOS transistor $MP_{72}$ and an nMOS transistor $MN_{71}$ connected in series between the first power supply line 201 and the second power supply line 202 and having a gate common-connected to the signal line 208, and a differential circuit comprising two nMOS transistors $MN_{73}$ and $MN_{74}$ having a source common-connected to the fourth power supply line 207, a gate of $MN_{73}$ being connected to the signal line 208 and a gate of $MN_{74}$ being connected to an output of the CMOS inverter (an inverted signal of the signal on the signal line 208), and two pMOS transistors $MP_{75}$ and $MP_{76}$ connected between the third power supply line 206 and a drain of the nMOS transistors $MN_{73}$ and $MN_{74}$, respectively, a gate of pMOS transistors $MP_{75}$ and $MP_{76}$ being cross-connected to the drain of the nMOS transistors $MN_{73}$ and $MN_{74}$, respectively. Namely, the gate of the pMOS transistor $MP_{75}$ is connected to the drain of the nMOS transistor $MN_{74}$, and the gate of the pMOS transistor $MP_{76}$ is connected to the drain of the nMOS transistor $MN_{73}$.

The output signal line 203 is connected to a connected node between the gate of the pMOS transistor $MP_{76}$ and the drain of the nMOS transistor $MP_{73}$. Incidentally, the level converter shown in FIG. 8 merely shows one example of the level converter 110, and therefore, the present invention is in no way limited to the level converter shown in FIG. 8.

Returning to FIG. 7, since the source of the nMOS transistor 103 is connected to the first power supply line 201, the potential $V_{hin}$ of the first power supply line 201 is determined by the potential $V_{hc}$ of the control signal line 204 and a current I flowing to the first power supply line 201, by the following equation (3):

$$V_{hin}=V_{hc}-\{(2I/Kn)^{1/\alpha_n}+V_{tn}\} \quad (3)$$

where

Kn is a gain constant of nMOS transistor 103

$V_{tn}$ is a threshold of nMOS transistor 103

$\alpha_n$ is a predetermined constant

Therefore, even if the potential given to the first power supply terminal 105 varies, the potential $V_{lin}$ on the second power supply line 201 does not vary.

On the other hand, since the source of the pMOS transistor 104 is connected to the second power supply line 202, the potential $V_{lin}$ of the second power supply line 202 is determined by the potential $V_{lc}$ of the control signal line 205 and a current I flowing to the second power supply line 202, by the following equation (4):

$$V_{lin}=V_{lc}+\{(2I/Kp)^{1/\alpha_p}+V_{tp}\} \quad (4)$$

where

Kp is a gain constant of pMOS transistor 104

$V_{tp}$ is a threshold of pMOS transistor 104

$\alpha_p$ is a predetermined constant

Therefore, even if the potential given to the second power supply terminal 106 varies, the potential $V_{lin}$ on the second power supply line 202 does not vary.

The frequency of the oscillator 101 changes dependently upon the potential difference between the first power supply line 201 and the second power supply line 202, and therefore, can be controlled by the potential of the control signal lines 205 and 206.

Since the oscillation signal outputted on the signal line 208 from the oscillator 101 takes the high level corresponding to the potential of the first power supply line 201 and the low level corresponding to the potential of the second power supply line 202, the signal thus obtained is converted by the level converter 110 to the signal which takes the high level corresponding to the potential of the third power supply line 206 and the low level corresponding to the potential of the fourth power supply line 207. This level-converted signal is outputted onto the output signal line 203.

If the above mentioned level conversion is not necessary, even if the level converter 110 as mentioned above is omitted, it is possible to realize the voltage controlled oscillator which has minimized the influence of the power supply voltage variation.

The approach for minimizing the influence of the power supply voltage variation by use of the MOS transistors in this third embodiment can be applied not only to the voltage controlled oscillator mentioned above but also to a voltage controlled oscillator in which the oscillator 101 is replaced with another circuit.

Figure 9:
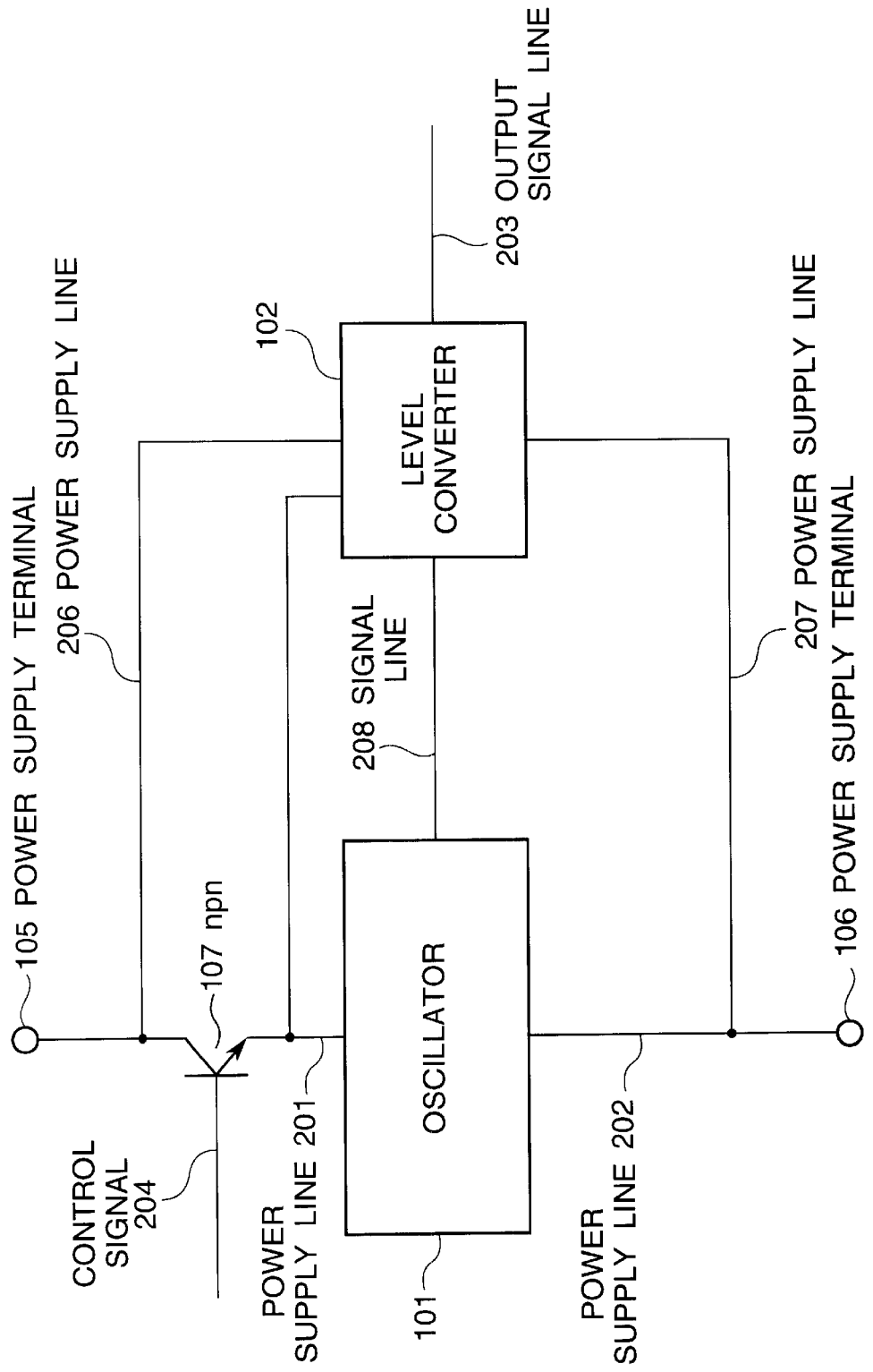
FIG. 9 is a block diagram of a fourth embodiment of the voltage controlled oscillator in accordance with the present invention.

Referring to FIG. 9, there is shown a block diagram of a fourth embodiment of the voltage controlled oscillator in accordance with the present invention. In FIG. 9, elements similar to those shown in FIG. 2 are given the same Reference Numerals. As seen from comparison between FIGS. 2 and 9, the fourth embodiment is characterized in that the nMOS transistor 103 in the first embodiment shown in FIG. 2 is replaced with an npn bipolar transistor 107.

In the fourth embodiment of the voltage controlled oscillator in accordance with the present invention as shown in FIG. 9, the oscillator 101 is connected between the first power supply line 201 and the second power supply line 202 connected to the second power supply terminal 106, and is configured to generate, on the signal line 208, the oscillation signal having the frequency corresponding to the potential difference between the first power supply line 201 and the second power supply line 202. The npn bipolar transistor 107 has a collector connected to the first power supply terminal 105, an emitter connected to the first power supply line 201, and a base connected to the control signal line 204. The oscillation signal outputted onto the signal line 208 takes the high level corresponding to the potential appearing on the first power supply line 201 and the low level corresponding to the potential appearing on the second power supply line 202. This signal outputted on the signal line 208 is supplied to the level converter 102, which converts the received signal into the signal, which takes the high level corresponding to the potential appearing on the third power supply line 206 and the low level corresponding to the potential appearing on the fourth power supply line 207. This output signal is outputted on the output signal line 203.

The oscillator 101 used in the fourth embodiment of the voltage controlled oscillator is constituted as shown in FIG. 3, similarly to the first embodiment, and the level converter 102 is also constituted as shown in FIG. 4, similarly to the first embodiment. However, the oscillator and the level converter shown in FIGS. 3 and 4 merely show one example of the oscillator and the level converter, and therefore, the present invention is in no way limited to the structures shown in FIGS. 3 and 4.

Returning to FIG. 9, since the emitter of the bipolar transistor 107 is connected to the first power supply line 201, the potential $V_{hin}$ of the first power supply line 201 is determined by the potential $V_{hc}$ of the control signal line 204 by the following equation (5):

$$V_{hin}=V_{hc}-V_{ben} \tag{5}$$

where $V_{ben}$ is a base-emitter voltage of npn bipolar transistor 107, which is a constant value Therefore, even if the potential given to the first power supply terminal 105 varies, the potential $V_{hin}$ on the first power supply line 201 does not vary.

The frequency of the oscillator 101 changes dependently upon the potential difference between the first power supply line 201 and the second power supply line 202, and therefore, can be controlled by the potential $V_{hc}$ of the control signal line 204.

Since the signal outputted on the signal line 208 from the oscillator 101 takes the high level corresponding to the potential of the first power supply line 201 and the low level corresponding to the potential of the second power supply line 202, the signal thus obtained is converted by the level converter 102 to the signal which takes the high level corresponding to the potential of the third power supply line 206 and the low level corresponding to the potential of the fourth power supply line 207. This level converted signal is outputted onto the output signal line 203.

If the above mentioned level conversion is not necessary, even if the level converter 102 as mentioned above is omitted, it is possible to obtain the above mentioned operational advantage of the present invention.

The above mentioned approach for minimizing the influence of the power supply voltage variation by use of the npn bipolar transistor in the above mentioned embodiment can be applied not only to the voltage controlled oscillator mentioned above but also to a voltage controlled oscillator in which the oscillator 101 is replaced with another circuit.

Figure 10:
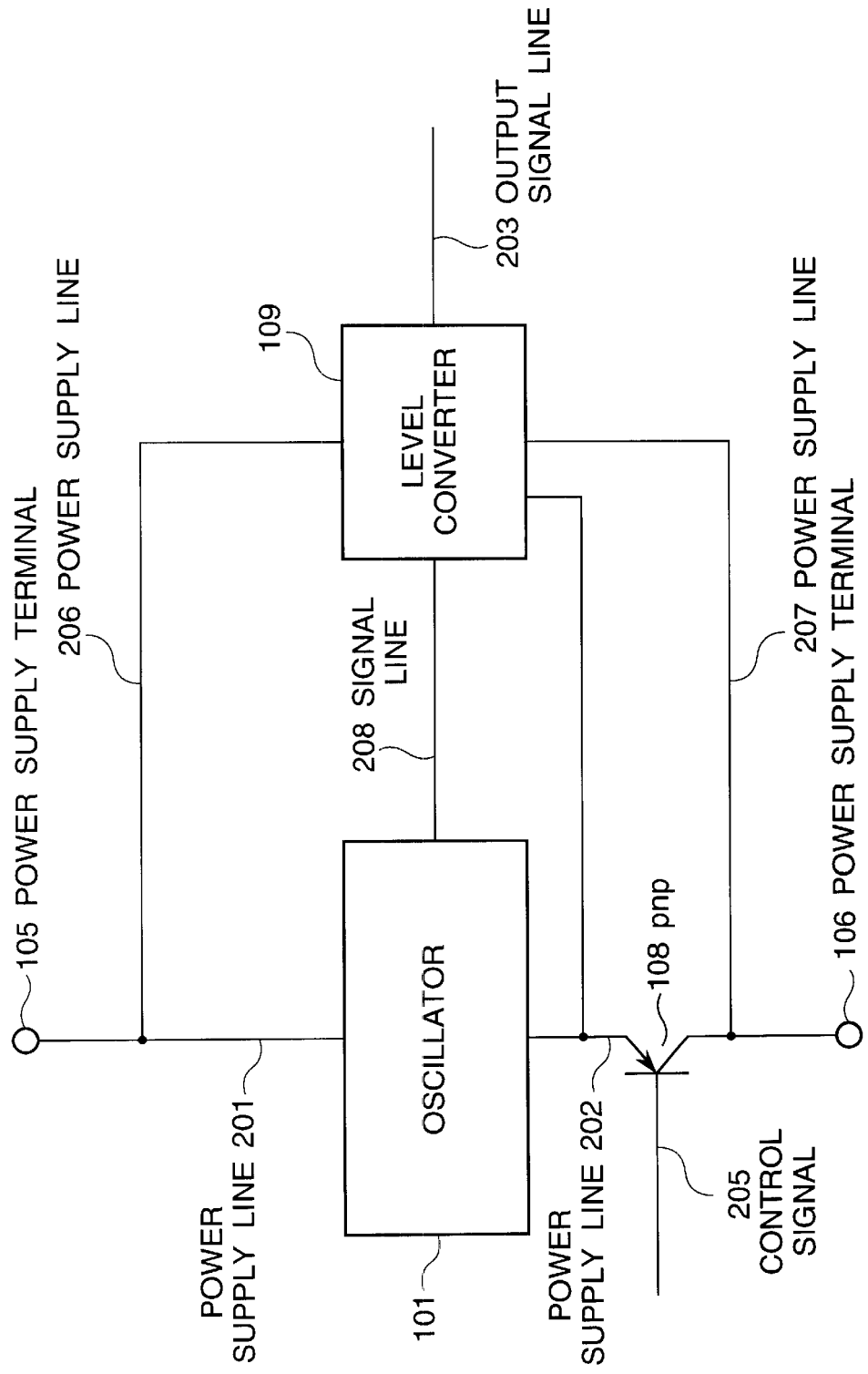
FIG. 10 is a block diagram of a fifth embodiment of the voltage controlled oscillator in accordance with the present invention.

Referring to FIG. 10, there is shown a block diagram of a fifth embodiment of the voltage controlled oscillator in accordance with the present invention. In FIG. 10, elements similar to those shown in FIG. 5 are given the same Reference Numerals. As seen from comparison between FIGS. 5 and 10, the fifth embodiment is characterized in that the pMOS transistor 104 in the second embodiment shown in FIG. 5 is replaced with a pnp bipolar transistor 108.

In the fifth embodiment of the voltage controlled oscillator in accordance with the present invention as shown in FIG. 10, the oscillator 101 is connected between the second power supply line 202 and the first power supply line 201 connected to the first power supply terminal 105, and is configured to generate on the signal line 208 the signal having the frequency corresponding to the potential difference between the first power supply line 201 and the second power supply line 202. The pnp bipolar transistor 108 has a collector connected to the second power supply terminal 106, an emitter connected to the second power supply line 202, and a base connected to the control signal line 205. The signal outputted onto the signal line 208 takes the high level corresponding to the potential appearing on the first power supply line 201 and the low level corresponding to the potential appearing on the second power supply line 202. This signal outputted on the signal line 208 is supplied to the level converter 109, which converts the received signal into the signal, which takes the high level corresponding to the potential appearing on the third power supply line 206 and the low level corresponding to the potential appearing on the fourth power supply line 207. This output signal is outputted on the output signal line 203.

The oscillator 101 used in the fifth embodiment of the voltage controlled oscillator is constituted as shown in FIG. 3, similarly to the second embodiment, and the level converter 109 is also constituted as shown in FIG. 6, similarly to the second embodiment. However, the oscillator and the level converter shown in FIGS. 3 and 6 merely show one example of the oscillator and the level converter, and therefore, the present invention is in no way limited to the structures shown in FIGS. 3 and 6.

Returning to FIG. 10, since the emitter of the bipolar transistor 108 is connected to the second power supply line 202, the potential $V_{lin}$ of the second power supply line 202 is determined by the potential $V_{lc}$ of the control signal line 205 by the following equation (6):

$$V_{lin}=V_{lc}-V_{bep} \tag{6}$$

where $V_{bep}$ is a base-emitter voltage of pnp bipolar transistor 108, which is a constant value Therefore, even if the potential given to the second power supply terminal 106 varies, the potential $V_{lin}$ on the second power supply line 202 does not vary.

The frequency of the oscillator 101 changes dependently upon the potential difference between the first power supply line 201 and the second power supply line 202, and therefore, can be controlled by the potential $V_{hc}$ of the control signal line 205.

Since the signal outputted on the signal line 208 from the oscillator 101 takes the high level corresponding to the potential of the first power supply line 201 and the low level corresponding to the potential of the second power supply line 202, the signal thus obtained is converted by the level converter 102 to the signal which takes the high level corresponding to the potential of the third power supply line 206 and the low level corresponding to the potential of the fourth power supply line 207. This level converted signal is outputted onto the output signal line 203.

If the above mentioned level conversion is not necessary, even if the level converter as mentioned above is omitted, it is possible to obtain the above mentioned operational advantage of the present invention.

The above mentioned approach for minimizing the influence of the power supply voltage variation by use of the pnp bipolar transistor in the above mentioned embodiment can be applied not only to the voltage controlled oscillator mentioned above but also to a voltage controlled oscillator in which the oscillator 101 is replaced with another circuit.

Figure 11:
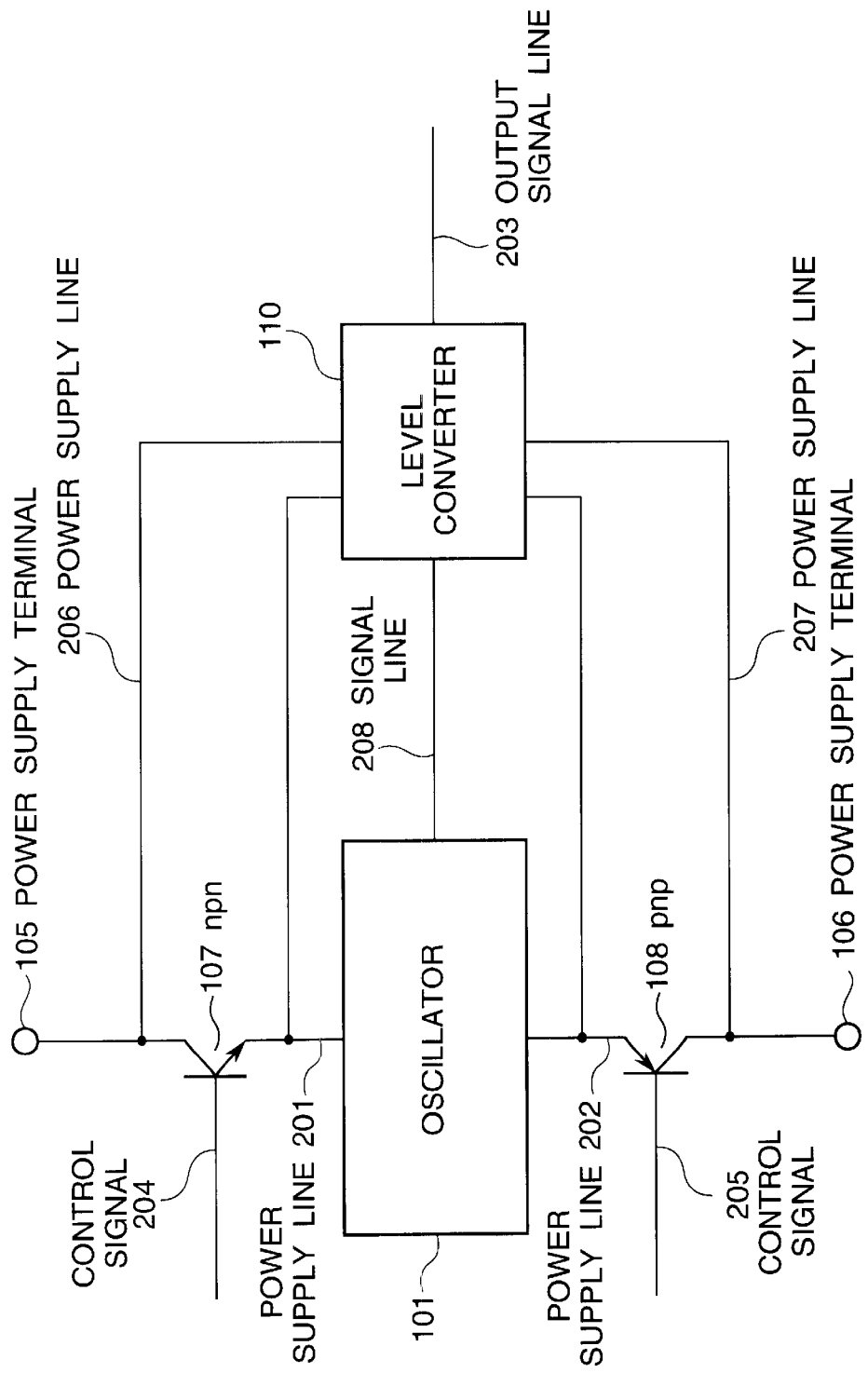
FIG. 11 is a block diagram of a sixth embodiment of the voltage controlled oscillator in accordance with the present invention.

Referring to FIG. 11, there is shown a block diagram of a sixth embodiment of the voltage controlled oscillator in accordance with the present invention. In FIG. 11, elements similar to those shown in FIG. 7 are given the same Reference Numerals. As seen from comparison between FIGS. 7 and 11, the sixth embodiment is characterized in that the nMOS transistor 103 and the pMOS transistor 104 in the third embodiment shown in FIG. 7 are replaced with an npn bipolar transistor 107 and a pnp bipolar transistor 108, respectively.

In the sixth embodiment of the voltage controlled oscillator in accordance with the present invention as shown in FIG. 11, the oscillator 101 is connected between the first power supply line 201 and the second power supply line 202, and is configured to generate on the signal line 208 the signal having the frequency corresponding to the potential difference between the first power supply line 201 and the second power supply line 202. The npn bipolar transistor 107 has a collector connected to the first power supply terminal 105, an emitter connected to the first power supply line 201, and a base connected to the control signal line 204. The pnp bipolar transistor 108 has a collector connected to the second power supply terminal 106, an emitter connected to the second power supply line 202, and a base connected to the control signal line 205. The signal outputted onto the signal line 208 takes the high level corresponding to the potential appearing on the first power supply line 201 and the low level corresponding to the potential appearing on the second power supply line 202.

This signal outputted on the signal line 208 is supplied to the level converter 110, which converts the received signal into the signal, which takes the high level corresponding to the potential appearing on the third power supply line 206 and the low level corresponding to the potential appearing on the fourth power supply line 207. This output signal is outputted on the output signal line 203.

The oscillator 101 used in the sixth embodiment of the voltage controlled oscillator is constituted as shown in FIG. 3, similarly to the third embodiment, and the level converter 110 is also constituted as shown in FIG. 8, similarly to the third embodiment. However, the oscillator and the level converter shown in FIGS. 3 and 8 merely show one example of the oscillator and the level converter, and therefore, the present invention is in no way limited to the structures shown in FIGS. 3 and 8.

Returning to FIG. 11, since the emitter of the bipolar transistor 107 is connected to the first power supply line 201, the potential $V_{hin}$ of the first power supply line 201 is determined by the potential $V_{hc}$ of the control signal line 204 by the following equation (7):

$$V_{hin}=V_{hc}-V_{ben} \tag{7}$$

where $V_{ben}$ is a base-emitter voltage of npn bipolar transistor 107, which is a constant value.

Therefore, even if the potential given to the first power supply terminal 105 varies, the potential $V_{hin}$ on the first power supply line 201 does not vary.

Furthermore, since the emitter of the bipolar transistor 108 is connected to the second power supply line 202, the potential $V_{lin}$ of the second power supply line 202 is determined by the potential $V_{lc}$ of the control signal line 205 by the following equation (8):

$$V_{lin}=V_{lc}-V_{bep} \tag{8}$$

where $V_{bep}$ is a base-emitter voltage of pnp bipolar transistor 108, which is a constant value Therefore, even if the potential given to the second power supply terminal 106 varies, the potential $V_{lin}$ on the second power supply line 202 does not vary.

The frequency of the oscillator 101 changes dependently upon the potential difference between the first power supply line 201 and the second power supply line 202, and therefore, can be controlled by the potential of the control signal lines 204 and 205.

Since the signal outputted on the signal line 208 from the oscillator 101 takes the high level corresponding to the potential of the first power supply line 201 and the low level corresponding to the potential of the second power supply line 202, the signal thus obtained is converted by the level converter 102 to the signal which takes the high level corresponding to the potential of the third power supply line 206 and the low level corresponding to the potential of the fourth power supply line 207. This level converted signal is outputted onto the output signal line 203.

If the above mentioned level conversion is not necessary, even if the level converter as mentioned above is omitted, it is possible to obtain the above mentioned operational advantage of the present invention.

The above mentioned approach for minimizing the influence of the power supply voltage variation by use of the bipolar transistors in the above mentioned embodiment can be applied not only to the voltage controlled oscillator mentioned above but also to a voltage controlled oscillator in which the oscillator 101 is replaced with another circuit.

Figure 12:
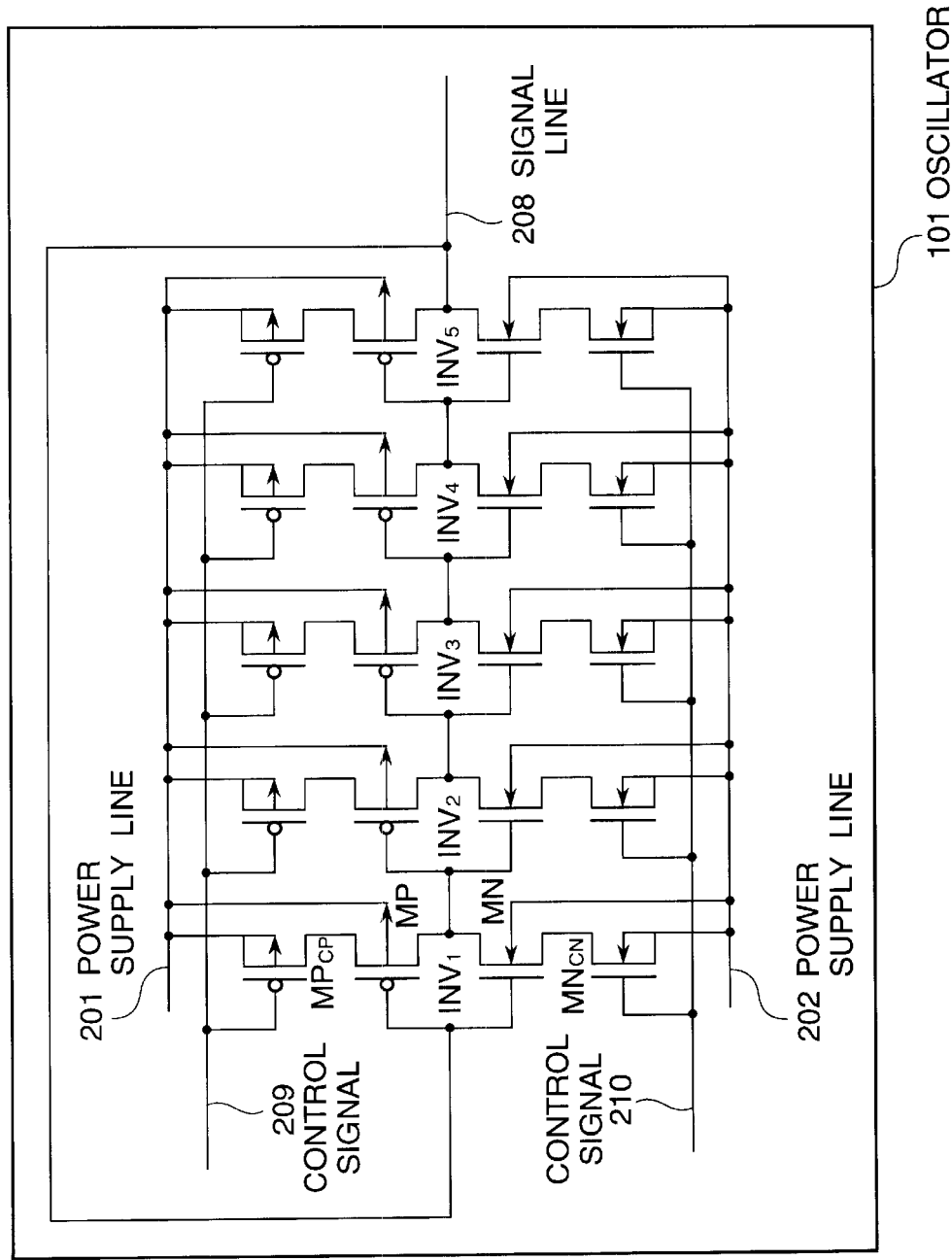
FIG. 12 is a circuit diagram of another example of the oscillator used in the embodiments of the voltage controlled oscillator in accordance with the present invention.

Referring to FIG. 12, there is shown a circuit diagram of another example of the oscillator used in the embodiments of the voltage controlled oscillator in accordance with the present invention.

The oscillator shown in FIG. 12 is configured to control a drive current of the odd number of CMOS inverters by means of a pair of additional control signal lines 209 and 210. Therefore, the oscillator shown in FIG. 12 has a pair of additional control signal terminals in addition to a terminal for the first power supply line 201, a terminal for the second power supply line 202, and a terminal for the output signal line 208.

The oscillator shown in FIG. 12 includes the odd number of CMOS inverters (in the shown example, five CMOS inverters $INV_1$ to $INV_5$) which are cascade-connected to form a ring or closed loop so as to constitute a ring oscillator, similarly to the oscillator shown in FIG 3. Furthermore, an additional pMOS transistor $MP_{CP}$ is connected between the first power supply line 201 and a source of the pMOS transistor MP of each CMOS inverter of all the CMOS inverters which constitute the ring oscillator, and a gate of each additional pMOS transistor $MP_{CP}$ is connected to the additional control signal line 209. An additional nMOS transistor $MN_{CN}$ is connected between the second power supply line 202 and a source of the nMOS transistor MN of each CMOS inverter, and a gate of each additional nMOS transistor $MN_{CN}$ is connected to the additional control signal line 210.

Now, operation will be described on a modified embodiment in which the oscillator shown in FIG. 12 is incorporated in the first embodiment of the voltage controlled oscillator shown in FIG. 2, in place of the oscillator shown in FIG. 3. Therefore, the modified embodiment can control the oscillation frequency by means of the control signal lines 204, 209 and 210.

Voltage levels of the control signal lines 209 and 210 respectively control a rising-up time and a falling-down time of each CMOS inverter of the CMOS inverters $INV_1$ to $INV_5$ which constitute the ring oscillator. In ordinary applications, therefore, in order to make the rising-up time and the falling-down time equal to each other, the voltage level $V_f$ of the control signal line 209 and the voltage level $V_r$ of the control signal line 210 are determined to fulfill a certain correlation, for example, $$V_r=f(V_f) \tag{9}$$

where the function f is determined by the characteristics of the pMOS transistors and the nMOS transistors connected to the control signal lines 209 and 210, respectively Thus, in ordinary applications, the oscillation frequency of the voltage controlled oscillator can be controlled by the two voltage levels of the control signal lines 204 and 209.

Here, the equation $V_r=f(V_f)$ will be discussed in detail.

A gate voltage $V_f$ and a drain current $I_f$ of the pMOS transistor connected to the control signal line 209 has the following relation:

$$I_f=K_p\{(V_{DD}-V_f)-V_{tp}\}^{\alpha_p}$$

where
  $V_{tp}$ is threshold of pMOS transistor
  $\alpha_p$ and $K_p$ are constants determined by pMOS transistor
  $V_{DD}$ is a potential of the power supply line 201

Similarly, a gate voltage $V_r$ and a drain current $I_r$ of the nMOS transistor connected to the control signal line 210 has the following relation:

$$I_r = K_n (V_r - V_{tn})^{\alpha_n}$$

where $V_{tn}$ is threshold of nMOS transistor $\alpha_n$ and $K_n$ are constants determined by nMOS transistor In order that the signal obtained from the output signal line 208 has the rising-up time and the falling-down time equal to each other, it must be $I_f = I_r$. Therefore, $K_p\{(V_{DD} - V_f) - V_{tp}\}^{\alpha_p} = K_n (V_r - V_{tn})^{\alpha_n}$.

Here, assuming that $K_p = K_n$, $V_{tp} = V_{tn}$, and $\alpha_p = \alpha_n$, it becomes $V_r = V_{DD} - V_f$. Accordingly, in this case, $f(x) = V_{DD} - x$.

Generally speaking, variation in device characteristics caused by variations in a threshold and a gate length of the transistors included in the voltage controlled oscillator, variation in characteristics values such as a resistance and a capacitance of wiring conductors, and variation in operational environments such as a temperature and a power supply voltage, result in variation of the gain of the voltage controlled oscillator, namely, variation of a changing rate of the oscillation frequency to the voltage level of the control signal lines.

Since this modified embodiment of the voltage controlled oscillator can control the oscillation frequency by the two voltage levels of the control signal line 204 and the control signal line 209, it is possible to use one of these control signal lines 204 and 209 for compensating for the above mentioned variations in the device characteristics, the wiring characteristics and the operational environments.

Figure 13:
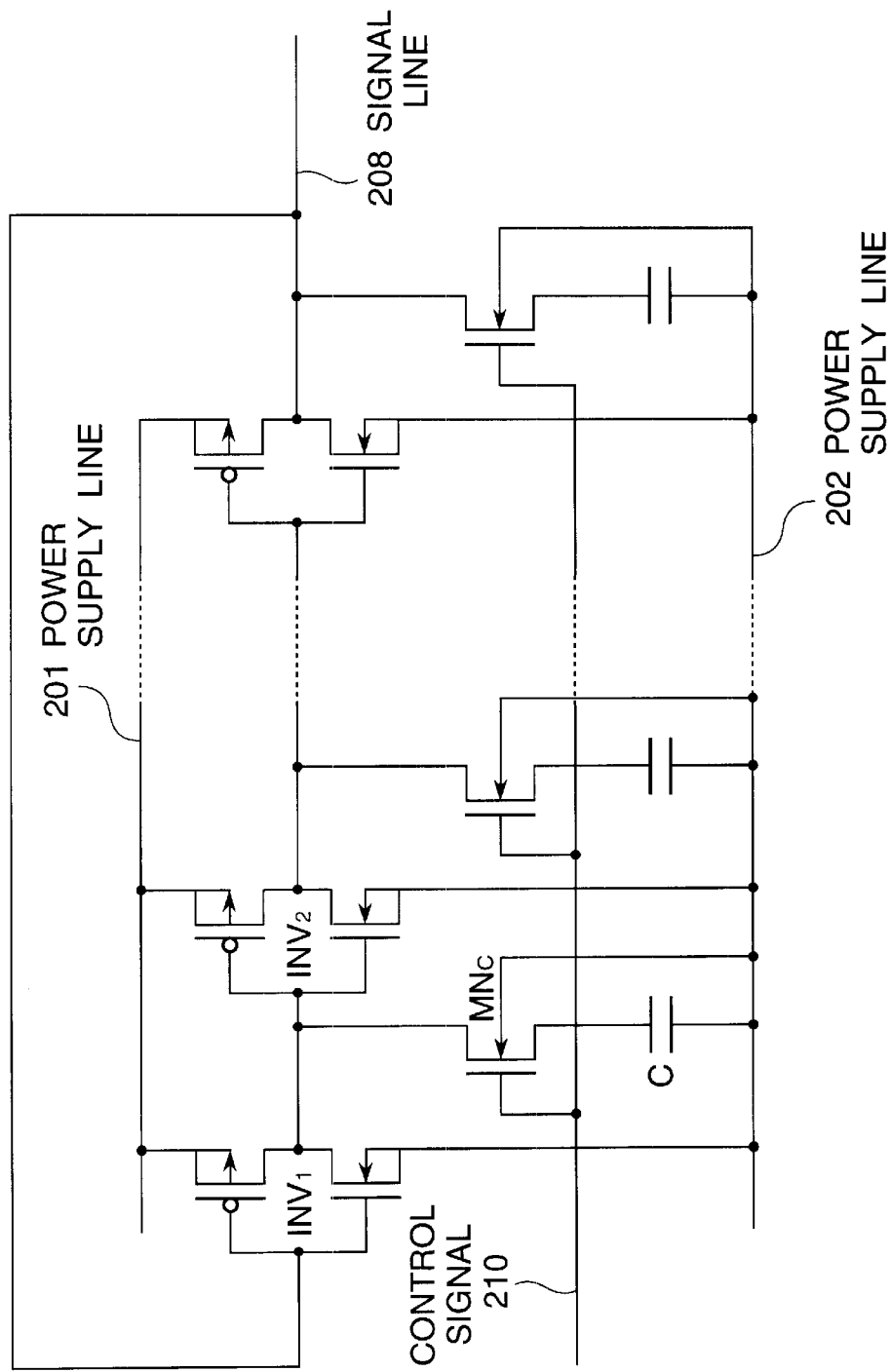
FIG. 13 is a circuit diagram of still another example of the oscillator used in the embodiments of the voltage controlled oscillator in accordance with the present invention.

Referring to FIG. 13, there is shown a circuit diagram of a third example of the oscillator which can be used in place of the oscillator shown in FIG. 12.

The third example of the oscillator shown in FIG. 13 includes the odd number of CMOS inverters $INV_1$, $INV_2$, . . . which are cascade-connected to form a ring or closed loop so as to constitute a ring oscillator, similarly to the oscillator shown in FIG. 3. Furthermore, an additional nMOS transistor $MN_C$ is connected at its drain to an output of of each CMOS inverter of all the CMOS inverters which constitute the ring oscillator, and a gate of each additional nMOS transistor $MN_C$ is connected to the additional control signal line 210. A source of the additional nMOS transistor $MN_C$ is connected to one end of a capacitor C, the other end of which is connected to the second power supply line 202. With this arrangement, an impedance of each nMOS transistor $MN_C$ is controlled by a voltage of the additional control signal line 210, so that a delay time of each CMOS inverter is changed, with the result that the oscillation frequency of the ring oscillator is changed or controlled by not only the voltage of the control signal line 204 (and/or 205) but also the voltage of the additional control signal line 210.

In addition, similarly to the oscillator shown in FIG. 3, in each of the oscillators shown in FIGS. 12 and 13, a substrate bias potential for each of the pMOS transistors included in each oscillator is connected to the first power supply line 201 and a substrate bias potential for each of the nMOS transistors in each oscillator is connected to the second power supply line 202. As mentioned hereinbefore, this substrate biasing can be surely realized in a triple-well structure, but can also be realized even in a double-well structure using a p-type substrate when the oscillator is incorporated in the first embodiment shown in FIG. 2, and even in a double-well structure using an n-type substrate when the oscillator is incorporated in the second embodiment shown in FIG. 5. This could be readily understood by persons skilled in the art.

As explained above, the voltage controlled oscillator in accordance with the present invention realizes an excellent insensibility against a power supply voltage variation, by utilizing the nature that a potential of a source electrode of a MOS transistor is determined by a gate voltage and a drain current, independently of a voltage of a drain electrode of the MOS transistor.

In brief, the voltage controlled oscillator in accordance with the present invention is characterized in that, in an oscillator having an oscillation frequency determined by a voltage difference between a first power supply line and a second power supply line, a MOS transistor is inserted in such a manner that a source of the MOS transistor is connected to the first or second power supply line and a drain of the MOS transistor is connected to a power supply voltage which may vary, so that the potential of the source of the MOS transistor is controlled, namely, determined by a voltage applied to a gate of the MOS transistor and a drain current of the MOS transistor. The drain current itself of the MOS transistor is determined by the gate voltage of the MOS transistor and a consumption current of the oscillator, and the consumption current of the oscillator is also directly determined by the gate voltage of the MOS transistor. Therefore, the oscillation frequency of the oscillator is determined by the gate voltage of the MOS transistor, and even if the voltage on the drain of the MOS transistor varies, the voltage on the source of the MOS transistor does not change, with the result that the voltage controlled oscillator in accordance with the present invention is not influenced by the power supply voltage variation.

In the voltage controlled oscillator in accordance with the present invention, even if a bipolar transistor is used in place of the MOS transistor, a similar advantage can be obtained.

The invention has thus been shown and described with reference to the specific embodiments. However, it should be noted that the present invention is in no way limited to the details of the illustrated structures but changes and modifications may be made within the scope of the appended claims.

What is claimed is:

1. A voltage controlled oscillator including:
an oscillator connected between a high potential power supply line and a low potential power supply line, to generate an oscillation signal having a frequency change dependent upon a voltage difference between said high potential power supply line and said low potential power supply line,
a transistor connected between one of said high potential power supply line and said low potential power supply line and a power supply terminal to supply voltage to said one of said high potential power supply line and said low potential power supply line, and
a level shift means connected to said high potential power supply line, said low potential power supply line and said power supply terminal,
a control signal being applied to a control electrode of said transistor to cause said transistor to change said voltage to said one of said high potential power supply line and said low potential power supply line, thereby to control said frequency of the oscillation of said oscillator, and further wherein said level shift means receives said oscillation signal output from said oscillator and converts a level of said oscillation signal corresponding to a potential of said one of said high potential power supply line and said low potential power supply line, to a voltage level of said power supply terminal.

2. A voltage controlled oscillator claimed in claim 1 wherein said transistor is a MOS transistor having a source connected to said one of said high potential power supply line and said low potential power supply line, and a drain connected to said power supply terminal, said control signal being applied to a gate electrode of said MOS transistor.

3. A voltage controlled oscillator claimed in claim 1 wherein said transistor is a bipolar transistor having an emitter connected to said one of said high potential power supply line and said low potential power supply line, and a collector connected to said power supply terminal, said control signal being applied to a base electrode of said MOS transistor.

4. A voltage controlled oscillator claimed in claim 1, wherein said oscillator has a control terminal, a terminal for said high potential power supply line, a terminal for said low potential power supply line, and a terminal for said oscillation signal, wherein said frequency of the oscillation signal generated by said oscillator is controlled by a voltage applied to said control terminal.

5. A voltage controlled oscillator claimed in claim 2, wherein said oscillator has a control terminal, a terminal for said high potential power supply line, a terminal for said low potential power supply line, and a terminal for said oscillation signal, wherein said frequency of the oscillation signal generated by said oscillator is controlled by a voltage applied to said control terminal.

6. A voltage controlled oscillator claimed in claim 3, wherein said oscillator has a control terminal, a terminal for said high potential power supply line, a terminal for said low potential power supply line, and a terminal for said oscillation signal, wherein said frequency of the oscillation signal generated said oscillator is controlled by a voltage applied to said control terminal.

7. A voltage controlled oscillator claimed in claim 1, wherein said oscillator has a terminal for said high potential power supply line, a terminal for said low potential power supply line, and a terminal for said oscillation signal, wherein said frequency of the oscillation signal generated by said oscillator is controlled by a voltage applied to said control terminal.

8. A voltage controlled oscillator comprising:
an oscillator connected between a first power supply line and a second power supply line and having an output node to output an oscillation signal having a frequency changed in accordance with a voltage difference between said first power supply line and said second power supply line;
a level converter connected to said second power supply line and a third power supply line and having an input node connected to said output node of said oscillator and an output terminal to output an output signal, said level converter converting an amplitude of said oscillation signal to an amplitude of said output signal corresponding to a voltage difference between said second power supply line and said third power supply line; and
a transistor connected between said first power supply line and said third power supply line and having a control electrode connected to receive a control signal so that in accordance with a voltage of said control signal, said transistor changes said voltage difference between said first power supply line and said second power supply line, whereby the oscillation frequency of said oscillation signal of said oscillator is controlled by said voltage of said control signal.

9. A voltage controlled oscillator claimed in claim 8, wherein said second power supply line is connected to a low potential power supply voltage, and said third power supply line is connected to a high potential power supply voltage, and said transistor is an nMOS transistor having a source connected to said first power supply line and a drain connected to said third power supply line, a gate of said nMOS transistor being connected to receive said control signal.

10. A voltage controlled oscillator claimed in claim 8, wherein said second power supply line is connected to a high potential power supply voltage, and said third power supply line is connected to a low potential power supply voltage, and said transistor is a pMOS transistor having a source connected to said first power supply line and a drain connected to said third power supply line, a gate of said pMOS transistor being connected to receive said control signal.

11. A voltage controlled oscillator claimed in claim 8, wherein said second power supply line is connected to a low potential power supply voltage, and said third power supply line is connected to a high potential power supply voltage, and said transistor is an npn transistor having a collector connected to said third power supply line and an emitter connected to said first power supply line, a base of said npn transistor being connected to receive said control signal.

12. A voltage controlled oscillator claimed in claim 8, wherein said second power supply line is connected to a high potential power supply voltage, and said third power supply line is connected to a low potential power supply voltage, and said transistor is a pnp transistor having a collector connected to said third power supply line and an emitter connected to said first power supply line, a base of said pnp transistor being connected to receive said control signal.

13. A voltage controlled oscillator comprising:
an oscillator connected between a first power supply line and a second power supply line and having an output node to output an oscillation signal having a frequency changed in accordance with a voltage difference between said first power supply line and said second power supply line;
a level converter between a third power supply line and a fourth power supply line and having an input node connected to said output node of said oscillator and an output terminal to output an output signal, said level converter converting an amplitude of said oscillation signal to an amplitude of said output signal corresponding to a voltage difference between said third power supply line and said fourth power supply line;
a first transistor connected between said first power supply line and said third power supply line and having a control electrode connected to receive a first control signal; and
a second transistor connected between said second power supply line and said fourth power supply line and having a control electrode connected to receive a second control signal, thereby the oscillation frequency of said oscillation signal of said oscillator is controlled by a voltage of said first control signal and a voltage of said second control signal.

14. A voltage controlled oscillator claimed in claim 13, wherein said third power supply line is connected to a high potential power supply voltage, and said fourth power supply line is connected to a low potential power supply voltage, and wherein said first transistor is an nMOS transistor having a source connected to said first power supply line and a drain connected to said third power supply line, a gate of said nMOS transistor being connected to receive said first control signal, and said second transistor is a pMOS transistor having a source connected to said second power supply line and a drain connected to said fourth power supply line, a gate of said pMOS transistor being connected to receive said second control signal.

15. A voltage controlled oscillator claimed in claim 13, wherein said third power supply line is connected to a high potential power supply voltage, and said fourth power supply line is connected to a low potential power supply voltage, and wherein said first transistor is an npn transistor having a collector connected to said third power supply line and an emitter connected to said first power supply line, a base of said npn transistor being connected to receive said first control signal, and said second transistor is a pnp transistor having a collector connected to said fourth power supply line and an emitter connected to said second power supply line, a base of said pnp transistor being connected to receive said second control signal.

* * * * *